US010366739B2

(12) United States Patent
Amarnath et al.

(10) Patent No.: US 10,366,739 B2
(45) Date of Patent: Jul. 30, 2019

(54) STATE DEPENDENT SENSE CIRCUITS AND SENSE OPERATIONS FOR STORAGE DEVICES

(71) Applicant: SanDisk Technologies LLC, Plano, TX (US)

(72) Inventors: Anirudh Amarnath, San Jose, CA (US); Tai-Yuan Tseng, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/627,947

(22) Filed: Jun. 20, 2017

(65) Prior Publication Data

US 2018/0366178 A1    Dec. 20, 2018

(51) Int. Cl.
| G11C 16/06 | (2006.01) |
| G11C 11/4091 | (2006.01) |
| G11C 11/4094 | (2006.01) |
| G11C 16/26 | (2006.01) |
| G11C 7/06 | (2006.01) |
| G11C 7/08 | (2006.01) |
| G11C 7/12 | (2006.01) |
| G11C 11/56 | (2006.01) |
| G11C 16/08 | (2006.01) |
| G11C 16/24 | (2006.01) |

(Continued)

(52) U.S. Cl.
CPC .......... *G11C 11/4091* (2013.01); *G11C 7/06* (2013.01); *G11C 7/062* (2013.01); *G11C 7/08* (2013.01); *G11C 7/12* (2013.01); *G11C 11/4094* (2013.01); *G11C 11/5642* (2013.01); *G11C 16/08* (2013.01); *G11C 16/24* (2013.01); *G11C 16/26* (2013.01); *G11C 16/32* (2013.01); *G11C 11/24* (2013.01); *G11C 16/0483* (2013.01); *G11C 16/30* (2013.01); *G11C 2211/5642* (2013.01)

(58) Field of Classification Search
CPC . G11C 11/4091; G11C 11/4094; G11C 16/08; G11C 11/5642; G11C 16/32; G11C 7/06; G11C 7/12; G11C 16/24; G11C 7/062; G11C 7/08; G11C 16/26; G11C 16/0483; G11C 2211/5642; G11C 11/24; G11C 16/30
USPC ..................................................... 365/185.21
See application file for complete search history.

(56) References Cited

U.S. PATENT DOCUMENTS

2005/0169082 A1*  8/2005  Cernea ................... G11C 7/062
                                                                 365/218
2006/0209592 A1*  9/2006  Li ....................... G11C 11/5642
                                                                365/185.03

(Continued)

*Primary Examiner* — Tha-O H Bui
(74) *Attorney, Agent, or Firm* — Brinks Gilson & Lione

(57) ABSTRACT

A circuit includes selected sense circuits configured to be connected to selected bit lines and unselected sense circuits configured to be connected to unselected bit lines during a sense operation. A voltage supply circuit may supply a selected pulse and an unselected pulse to the selected and unselected sense circuits. The selected sense circuits may pass the selected pulse to associated charge-storing circuits, and reject the unselected pulse. The unselected sense circuits may pass the unselected pulse to associated charge-storing circuits, and reject the selected pulse. In addition, voltage-setting circuitry may set sense voltages in the unselected sense circuits to a pre-sense level that matches the pre-sense level of communication voltages in the unselected sense circuits.

20 Claims, 14 Drawing Sheets

(51) Int. Cl.
  *G11C 16/32* (2006.01)
  *G11C 11/24* (2006.01)
  *G11C 16/04* (2006.01)
  *G11C 16/30* (2006.01)

(56) References Cited

U.S. PATENT DOCUMENTS

| | | |
|---|---|---|
| 2009/0296469 A1 | 12/2009 | Guterman |
| 2012/0008410 A1 | 1/2012 | Huynh et al. |
| 2012/0250425 A1 | 10/2012 | Yoshihara et al. |
| 2013/0223154 A1 | 8/2013 | Lutze et al. |
| 2013/0279254 A1 | 10/2013 | Kamata et al. |
| 2013/0279255 A1 | 10/2013 | Kamata et al. |
| 2013/0286738 A1 | 10/2013 | Kamata |
| 2013/0294157 A1 | 11/2013 | Sharon et al. |
| 2014/0003157 A1 | 1/2014 | Mui et al. |
| 2014/0119126 A1 | 5/2014 | Dutta et al. |
| 2014/0133229 A1 | 5/2014 | Kamei et al. |
| 2014/0269093 A1 | 9/2014 | Maejima |
| 2014/0269094 A1 | 9/2014 | Maeda |
| 2014/0286101 A1 | 9/2014 | Ito |
| 2014/0286104 A1 | 9/2014 | Kamata et al. |
| 2015/0049553 A1* | 2/2015 | Maejima .......... G11C 16/26 365/185.18 |
| 2015/0071005 A1 | 3/2015 | Maejima et al. |
| 2015/0221348 A1 | 8/2015 | Tseng et al. |
| 2015/0221391 A1 | 8/2015 | Tseng et al. |
| 2015/0380099 A1 | 12/2015 | Maejima |
| 2016/0078929 A1 | 3/2016 | Maejima |
| 2016/0078953 A1 | 3/2016 | Bushnaq et al. |
| 2016/0086674 A1 | 3/2016 | Ray et al. |
| 2016/0189777 A1 | 6/2016 | Yoshihara et al. |
| 2016/0189790 A1 | 6/2016 | Ma et al. |
| 2016/0203874 A1 | 7/2016 | Maejima |
| 2016/0267971 A1 | 9/2016 | Maejima |
| 2016/0268001 A1 | 9/2016 | Harada |
| 2016/0351254 A1 | 12/2016 | Li et al. |
| 2016/0351722 A1 | 12/2016 | Zhou et al. |
| 2017/0076812 A1 | 3/2017 | Chu et al. |
| 2017/0116076 A1 | 4/2017 | Sharma et al. |
| 2017/0125117 A1 | 5/2017 | Tseng et al. |

* cited by examiner

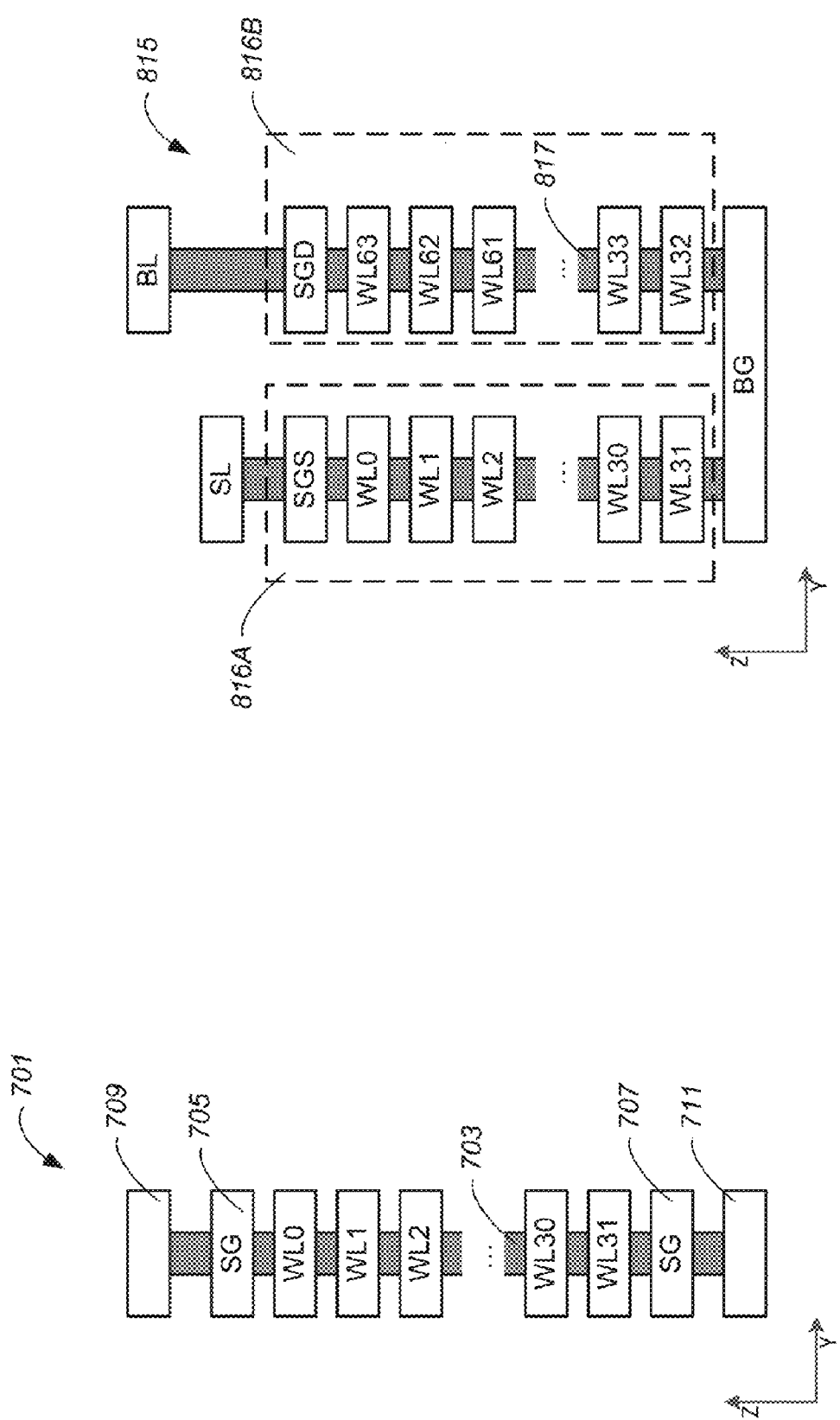

STATE DEPENDENT SENSE CIRCUITS AND SENSE OPERATIONS FOR STORAGE DEVICES

BACKGROUND

In storage devices, sense amplifiers are included on memory dies to sense current flowing through bit lines in order to determine the data values of the data that memory cells are storing or in order to verify that data has been correctly programmed into the memory cells. During a sense operation, some bit lines of a block are selected while others are unselected. Whether a given bit line is selected or unselected may depend on whether a sense controller desires to know the current flow through that bit line.

A sense amplifier may include a sense node that generates a sense voltage at a level corresponding to charge accumulated at the sense node. A sense operation includes a discharge period during which accumulated charge may discharge according to current flowing through an associated bit line. In turn, the sense voltage may drop to a discharge level after a certain amount of time that indicates the current flow through the bit line. Depending on whether the sense voltage drops below a trip voltage level may indicate certain information, such as the data values of the data being stored in a memory cell or whether the memory cell is sufficiently programmed. Consequently, in the event that the sense voltage does not drop to a level that accurately indicates the current flow through the bit line, then an inaccurate detection of the data being stored in a memory cell or an inaccurate detection of whether the memory cell has been sufficiently programmed may be made. As such, ways to improve a sense amplifier's ability to discharge the sense voltage to the correct level are desirable.

BRIEF DESCRIPTION OF THE DRAWINGS

The accompanying drawings, which are incorporated in and constitute a part of this specification illustrate various aspects of the invention and together with the description, serve to explain its principles. Wherever convenient, the same reference numbers will be used throughout the drawings to refer to the same or like elements.

FIG. 7 is an example physical structure of a three-dimensional (3-D) NAND string.

FIG. 8 is an example physical structure of a U-shaped 3-D NAND string.

DETAILED DESCRIPTION

Overview

Figure 1A:
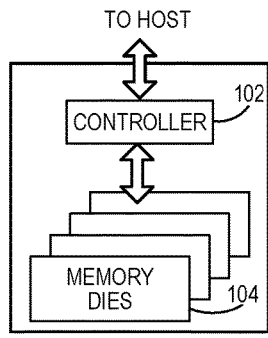
FIG. 1A is a block diagram of an exemplary non-volatile memory system.

By way of introduction, the below embodiments relate to apparatus, devices, systems, circuits, and methods for performing sense operations that set different sense voltages in the sense circuits depending on whether the sense circuits are connected to selected or unselected bit lines. In a first embodiment, a circuit includes a sense circuit coupled to a bit line. The sense circuit includes a charge-storing circuit configured to generate a sense voltage, and an input circuit. The input circuit is configured to: supply a first pulse to the charge-storing circuit in response to the bit line comprising a selected bit line; and supply a second pulse to the charge-storing circuit in response to the bit line comprising an unselected bit line.

In some embodiments, the input circuit includes a first transmission gate and a second transmission gate. The first transmission gate is configured to: receive the first pulse; and supply the first pulse to the charge-storing circuit in response to at least one voltage enabling the first transmission gate. The second transmission gate is configured to: receive the second pulse; and supply the second pulse to the charge-storing circuit in response to the at least one voltage enabling the second transmission gate.

In some embodiments, an auxiliary latch is configured to generate a selected voltage and an unselected voltage, and supply the selected voltage and the unselected voltage to the input circuit to alternatingly enable and disable the first and second transmission gates.

In some embodiments, voltage supply circuitry is configured to supply the first pulse and the second pulse to the input circuit.

In some embodiments, the voltage supply circuitry is configured to begin supplying the second pulse to the input circuit before the voltage supply circuitry begins supplying the first pulse to the input circuit.

In some embodiments, the voltage supply circuitry is configured to supply the second pulse with a lower magnitude than the first pulse.

In some embodiments, the sense circuit further includes a communication node configured to generate a communication voltage at a predetermined level corresponding to the bit line comprising an unselected bit line, and a transistor configured to pull up the sense voltage to the predetermined level prior to a discharge period.

In some embodiments, voltage supply circuitry is configured to output the second pulse to the input circuit before the transistor pulls up the sense voltage to the predetermined level.

In some embodiments, the voltage supply circuitry is configured to output the second pulse at the predetermined level.

In some embodiments, the voltage supply circuitry is configured to output the first pulse after the transistor pulls up the sense voltage to the predetermined level.

In another embodiment, a circuit includes a sense amplifier circuit connected to an unselected bit line. The sense amplifier circuit includes: a sense node configured to generate a sense voltage in response to a pulse; a communication node configured to generate a communication voltage at a pre-sense level; a transistor configured to form a charge-sharing relationship between the sense node and the communication node; and a voltage-setting circuit configured to set the sense voltage to the pre-sense level prior to a discharge period of a sense operation.

In some embodiments, the pulse comprises a first pulse corresponding to the unselected bit line, and the circuit further includes: an input circuit configured to: receive the first pulse and a second pulse corresponding to a selected bit line; supply the first pulse to a charge-storing circuit connected to the sense node; and reject the second pulse corresponding to the selected bit line.

In some embodiments, the input circuit includes: a first transmission gate configured to receive the first pulse and supply the first pulse to the charge-storing circuit; and a second transmission gate configured to prevent the second pulse from being supplied to the charge-storing circuit.

In some embodiments, an auxiliary latch is configured to control the input circuit to supply the first pulse to the charge-storing circuit and to reject the second pulse.

In some embodiments, the circuit includes voltage supply circuitry configured to supply the pulse, and a capacitor coupled to the sense node. The capacitor is configured to generate the sense voltage at a level corresponding to the pre-sense level multiplied by a coupling ratio of the capacitor in response to the pulse. The voltage-setting circuit is configured to pull-up the voltage from the level corresponding to the pre-sense level multiplied by the coupling ratio to the pre-sense level.

In some embodiments, the pulse comprises a first pulse corresponding to the unselected bit line, and the voltage supply circuitry is configured to output a second pulse corresponding to a selected bit line after the transistor pulls up the sense voltage to the pre-sense level.

In another embodiment, a system includes voltage supply circuitry configured to output a pulse during a sense operation; and a plurality of sense circuits. Each sense circuit of the plurality of sense circuits is connected to a respective one of a plurality of bit lines of a memory block. In addition, the plurality of sense circuits includes a first sense circuit and a second sense circuit. The first sense circuit is connected to a selected bit line of the plurality of bit lines during the sense operation. Also, the first sense circuit includes a first capacitor configured to generate a first sense voltage in response to receipt of the pulse. The second sense circuit is connected to an unselected bit line of the plurality of bit lines during the sense operation. In addition, the second sense circuit includes: a second capacitor unresponsive to the pulse, and a pull-up transistor configured to pull up a level of a second sense voltage to match a communication voltage level of a communication node.

In some embodiments, the pulse comprises a first pulse corresponding to the selected bit line, the voltage supply circuitry is further configured to output a second pulse corresponding to the unselected bit line, the first sense circuit further comprises a first input circuit configured to pass the first pulse to the first capacitor and reject the second pulse, and the second circuit further includes a second input circuit configured to pass the second pulse to the second capacitor and reject the first pulse.

In some embodiments, a first auxiliary latch is configured to control whether the first input circuit passes or rejects each of the first and second pulses, and a second auxiliary latch configured to control whether the second input circuit passes or rejects each of the first and second pulses.

In some embodiments, the voltage supply circuitry is configured to begin outputting the second pulse before the pull-up transistor pulls up the level of the second sense voltage; and begin outputting the first pulse after the pull-up transistor pulls up the level of the second sense voltage.

Other embodiments are possible, and each of the embodiments can be used alone or together in combination. Accordingly, various embodiments will now be described with reference to the attached drawings.

EMBODIMENTS

The following embodiments describe apparatuses, devices, systems, and methods for performing sense operations that set different sense voltages in the sense circuits depending on whether the sense circuits are connected to selected or unselected bit lines. Before turning to these and other embodiments, the following paragraphs provide a discussion of exemplary memory systems and storage devices that can be used with these embodiments. Of course, these are just examples, and other suitable types of memory systems and/or storage devices can be used.

FIG. 1A is a block diagram illustrating a memory system 100. The memory system 100 may include a controller 102 and memory that may be made up of one or more memory dies 104. As used herein, the term die refers to the set of memory cells, and associated circuitry for managing the physical operation of those memory cells, that are formed on a single semiconductor substrate. The controller 102 may interface with a host system and transmit command sequences for read, program, and erase operations to the non-memory die(s) 104.

The controller 102 (which may be a flash memory controller) can take the form of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, the controller 102 is a device that manages data stored in the memory die(s) and communicates with a host, such as a computer or electronic device. The controller 102 can have various functionality in addition to the specific functionality described herein. For example, the controller 102 can format the memory dies 104 to ensure the it is operating properly, map out bad flash memory cells, and allocate spare cells to be substituted for future failed cells. Some part of the spare cells can be used to hold firmware to operate the controller 102 and implement other features. In operation, when a host needs to read data from or write data to the memory die(s) 104, the host will communicate with the controller 102. If the host provides a logical address to which data is to be read/written, the controller 102 can convert the logical address received from the host to a physical address in the memory die(s) 104. (Alternatively, the host can provide the physical address). The controller 102 can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between the controller 102 and the non-volatile memory die(s) 104 may be any suitable interface, such as flash interface, including those configured for Toggle Mode 200, 400, 800, 1000 or higher. For some example embodiments, the memory system 100 may be a card based system, such as a secure digital (SD) or a micro secure digital (micro-SD) card. In alternate example embodiments, the memory system 100 may be part of an embedded memory system.

In the example illustrated in FIG. 1A, the memory system 100 is shown as including a single channel between the controller 102 and the non-volatile memory die(s) 104. However, the subject matter described herein is not limited to memory systems having a single memory channel. For example, in some memory systems, such as those embodying NAND architectures, 2, 4, 8 or more channels may exist between the controller 102 and the memory die(s) 104, depending on controller capabilities. In any of the embodiments described herein, more than a single channel may exist between the controller and the memory die(s)s 104, even if a single channel is shown in the drawings.

Figure 1B:
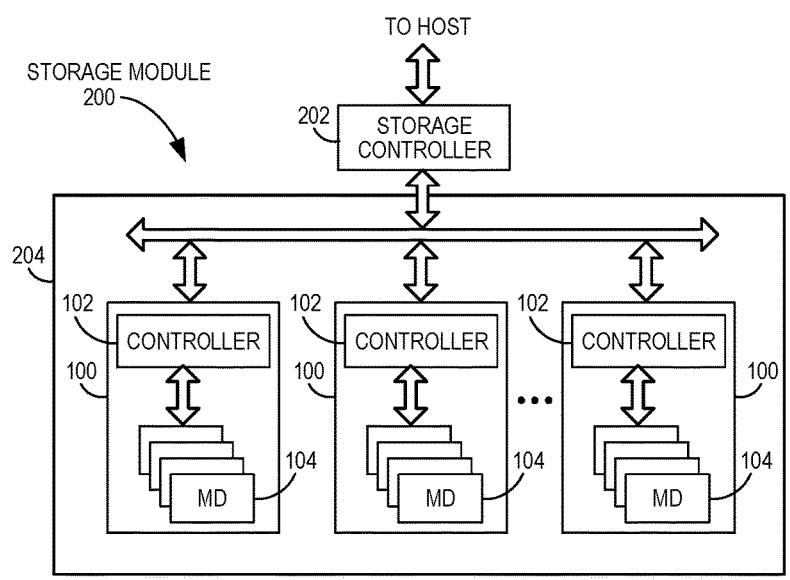
FIG. 1B is a block diagram of a storage module that includes a plurality of non-volatile memory systems.

FIG. 1B illustrates a storage module 200 that includes plural non-volatile memory systems 100. As such, the storage module 200 may include a storage controller 202 that interfaces with a host and with a storage system 204, which includes a plurality of non-volatile memory systems 100. The interface between the storage controller 202 and non-volatile memory systems 100 may be a bus interface, such as a serial advanced technology attachment (SATA), a peripheral component interface express (PCIe) interface, an embedded MultiMediaCard (eMMC) interface, a SD interface, or a Universal Serial Bus (USB) interface, as examples. The storage module 200, in one embodiment, may be a solid state drive (SSD), such as found in portable computing devices, such as laptop computers and tablet computers, and mobile phones.

Figure 1C:
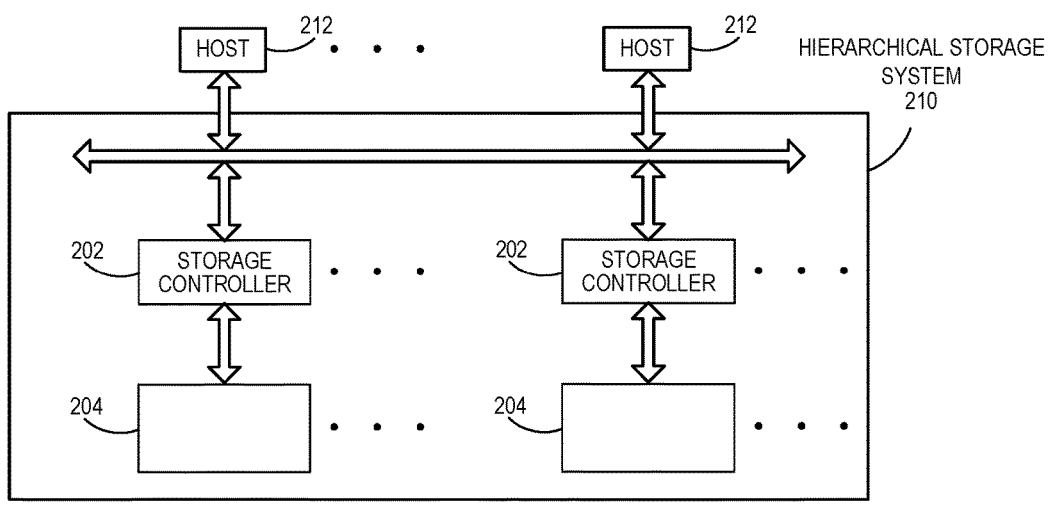
FIG. 1C is a block diagram of a hierarchical storage system.

FIG. 1C is a block diagram illustrating a hierarchical storage system 210. The hierarchical storage system 210 may include a plurality of storage controllers 202, each of which control a respective storage system 204. Host systems 212 may access memories within the hierarchical storage system 210 via a bus interface. Example bus interfaces may include a non-volatile memory express (NVMe), a fiber channel over Ethernet (FCoE) interface, an SD interface, a USB interface, a SATA interface, a PCIe interface, or an eMMC interface as examples. In one embodiment, the storage system 210 illustrated in FIG. 1C may be a rack mountable mass storage system that is accessible by multiple host computers, such as would be found in a data center or other location where mass storage is needed.

Figure 2A:
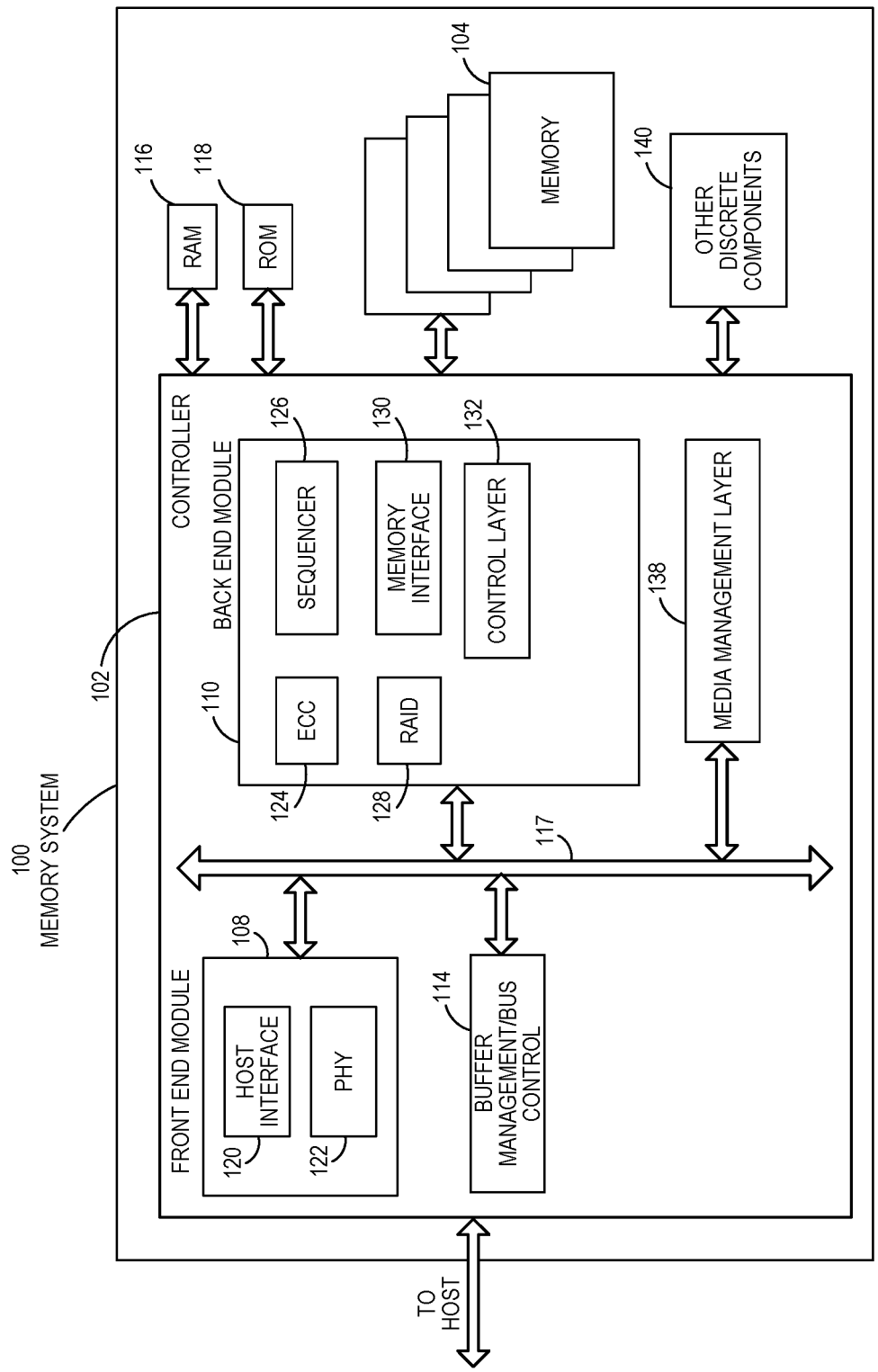
FIG. 2A is a block diagram of exemplary components of a controller of the non-volatile memory system of FIG. 1A.

FIG. 2A is a block diagram illustrating exemplary components of the controller 102 in more detail. The controller 102 may include a front end module 108 that interfaces with a host, a back end module 110 that interfaces with the non-volatile memory die(s) 104, and various other modules that perform various functions of the non-volatile memory system 100. In general, a module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition or alternatively, each module may include memory hardware that comprises instructions executable with a processor or processor circuitry to implement one or more of the features of the module. When any one of the module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module.

The controller 102 may include a buffer manager/bus controller module 114 that manages buffers in random access memory (RAM) 116 and controls the internal bus arbitration for communication on an internal communications bus 117 of the controller 102. A read only memory (ROM) 118 may store and/or access system boot code. Although illustrated in FIG. 2A as located separately from the controller 102, in other embodiments one or both of the RAM 116 and the ROM 118 may be located within the controller 102. In yet other embodiments, portions of RAM 116 and ROM 118 may be located both within the controller 102 and outside the controller 102. Further, in some implementations, the controller 102, the RAM 116, and the ROM 118 may be located on separate semiconductor dies.

Additionally, the front end module 108 may include a host interface 120 and a physical layer interface (PHY) 122 that provide the electrical interface with the host or next level storage controller. The choice of the type of the host interface 120 can depend on the type of memory being used. Example types of the host interface 120 may include, but are not limited to, SATA, SATA Express, SAS, Fibre Channel, USB, PCIe, and NVMe. The host interface 120 may typically facilitate transfer for data, control signals, and timing signals.

The back end module 110 may include an error correction code (ECC) engine or module 124 that encodes the data bytes received from the host, and decodes and error corrects the data bytes read from the non-volatile memory die(s) 104. The back end module 110 may also include a command sequencer 126 that generates command sequences, such as program, read, and erase command sequences, to be transmitted to the non-volatile memory die(s) 104. Additionally, the back end module 110 may include a RAID (Redundant Array of Independent Drives) module 128 that manages generation of RAID parity and recovery of failed data. The RAID parity may be used as an additional level of integrity protection for the data being written into the non-volatile memory system 100. In some cases, the RAID module 128 may be a part of the ECC engine 124. A memory interface 130 provides the command sequences to the non-volatile memory die(s) 104 and receives status information from the non-volatile memory die(s) 104. Along with the command sequences and status information, data to be programmed into and read from the non-volatile memory die(s) 104 may be communicated through the memory interface 130. In one embodiment, the memory interface 130 may be a double data rate (DDR) interface and/or a Toggle Mode 200, 400, 800, or higher interface. A control layer 132 may control the overall operation of back end module 110.

Additional modules of the non-volatile memory system 100 illustrated in FIG. 2A may include a media management layer 138, which performs wear leveling of memory cells of the non-volatile memory die 104, address management, and facilitates folding operations as described in further detail below. The non-volatile memory system 100 may also include other discrete components 140, such as external electrical interfaces, external RAM, resistors, capacitors, or other components that may interface with controller 102. In alternative embodiments, one or more of the RAID module 128, media management layer 138 and buffer management/bus controller 114 are optional components that may not be necessary in the controller 102.

Figure 2B:
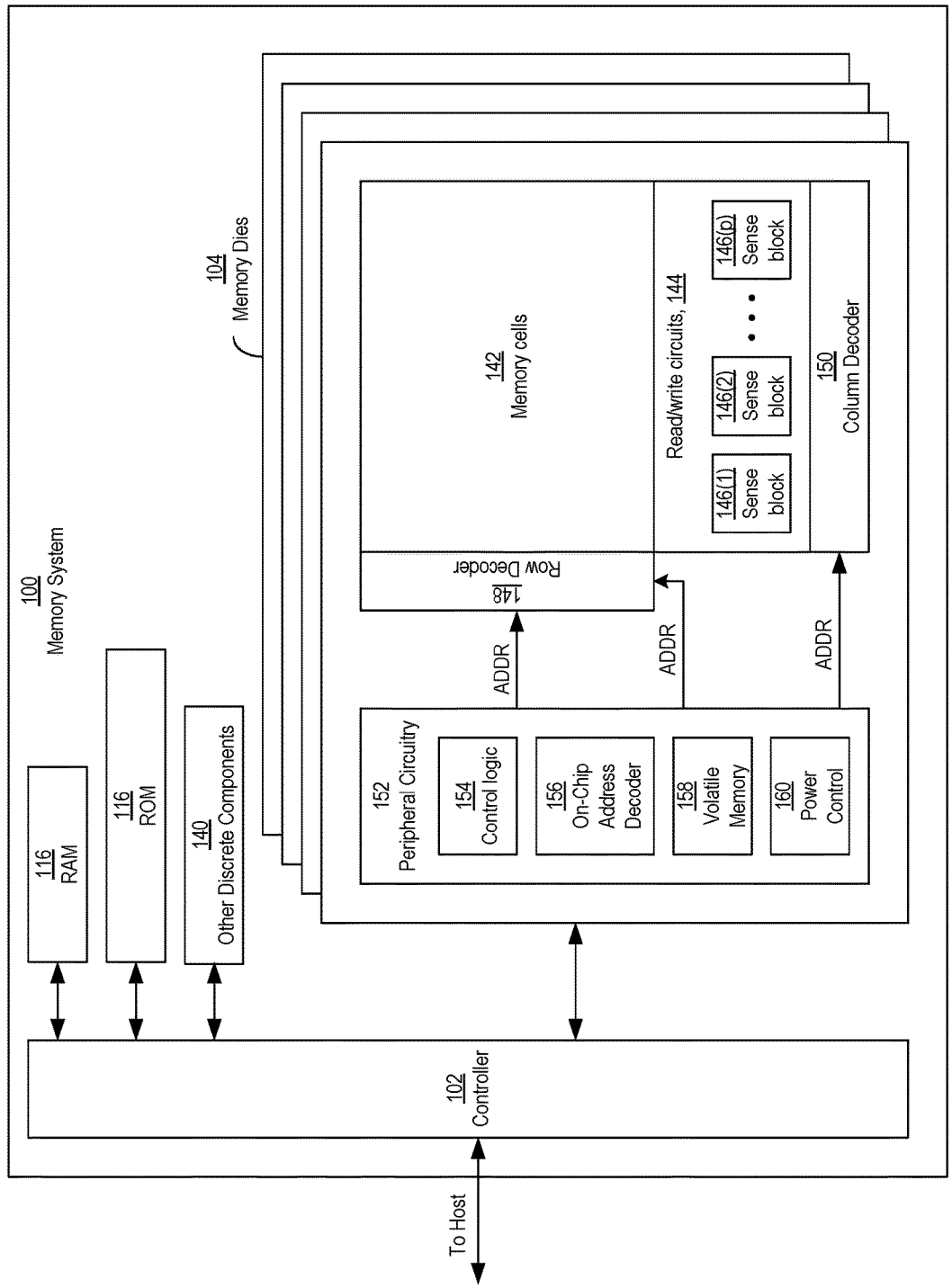
FIG. 2B is a block diagram of exemplary components of a non-volatile memory die of the non-volatile memory system of FIG. 1A.

FIG. 2B is a block diagram illustrating exemplary components of a memory die 104 in more detail. The memory die 104 may include a memory cell structure 142 that includes a plurality of memory cells or memory elements. Any suitable type of memory can be used for the memory cells 142. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory may have different configurations. For example, flash memory devices may be configured in a NAND or a NOR configuration.

The memory can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

Figure 3:
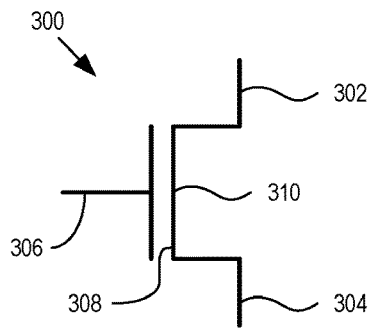
FIG. 3 is a circuit diagram of an example floating gate transistor.

For some memory configurations, such as flash memory, a memory cell of the plurality of memory cells 142 may be a floating gate transistor (FGT). FIG. 3 shows a circuit schematic diagram of an example FGT 300. The FGT 300 may include a source 302, a drain 304, a control gate 306, a floating gate 308, and a substrate 310. The floating gate 308 may be surrounded by an insulator or insulating material that helps retain charge in the floating gate 308. The presence or absence of charges inside the floating gate 308 may cause a shift in a threshold voltage of the FGT, which is used to distinguish logic levels. For each given charge stored in the floating gate 308, a corresponding drain-to-source conduction current ID with respect to a fixed control gate Voltage $V_{CG}$ applied to the control gate 306 occurs. Additionally, the FGT 300 may have an associated range charges that can be programmable onto its floating gate 308 that define a corresponding threshold voltage window or a corresponding conduction current window. In this way, the FGT's threshold voltage may be indicative of the data stored in the memory cell.

Figure 4:
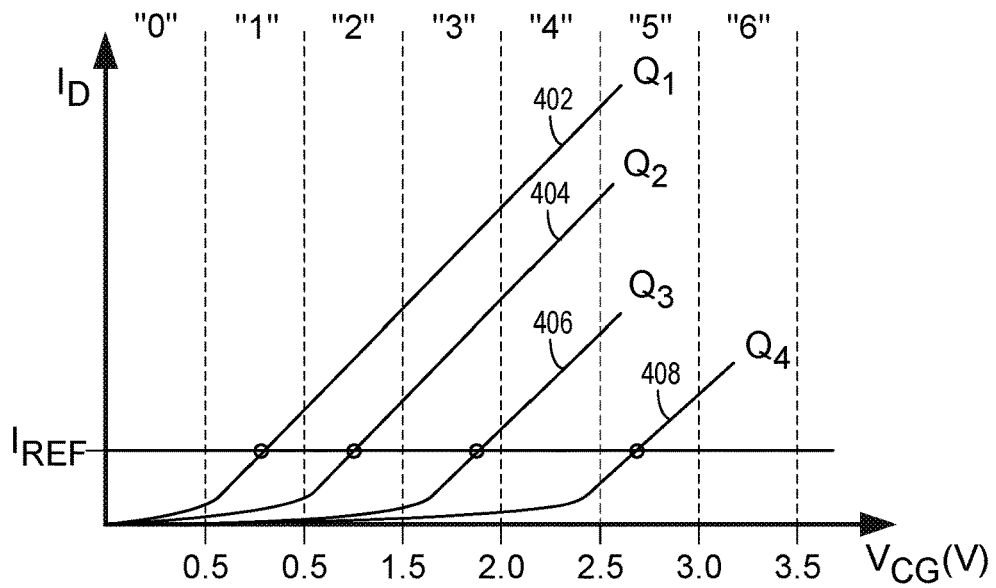
FIG. 4 is a graph of curves of drain-to-source current as a function of control gate voltage drawn through a floating gate transistor.

FIG. 4 is graph showing four curves 402, 404, 406, 408 of drain-to-source current ID drawn through the FGT 300 as a function of a control gate voltage $V_{CG}$ applied to the control gate 306. Each curve 402-408 corresponds to a respective one of four different charges or charge levels Q1, Q2, Q3, Q4 that the floating gate 308 can selectively store at any given time. Otherwise stated, the four curves 402-408 represent four possible charge levels that can be programmed on the floating gate 308 of the FGT 300, respectively corresponding to four possible memory states. In the example graph in FIG. 4, the threshold voltage window of a population of FGTs range from 0.5 volts (V) to 3.5 V. Seven possible memory states "0", "1", "2", "3", "4", "5", and "6" are defined or extend across the threshold voltage window, and respectively represent one erased states and six programmed states. The different states can be demarcated by partitioning the threshold voltage window into six regions of 0.5 V intervals. The FGT 300 may be in one of the states according to the charge stored in its floating gate 308 and where its drain-to-source current ID intersects a reference current $I_{REF}$. For example, a FGT programmed to store charge Q1 in memory state "1" since its curve 402 intersects the reference current $I_{REF}$ in a region of the threshold voltage region demarcated by the control gate voltage $V_{CG}$ in a range from 0.5 V to 1.0 V. The more memory states the FGT 300 is programmed to store, the more finely divided are the regions defining the threshold voltage window. In some examples configurations, the threshold voltage window may extend from −1.5 V to 5 V, providing a maximum width of 6.5 V. If the FGT 300 can be programmed into any one of sixteen possible states, each state may occupy a respective region spanning 200 millivolts (mV) to 300 mV. The higher the resolution of the threshold voltage window (i.e., more states into which the FGT 300 can be programmed), the higher the precision that is needed in programming and reading operations to successfully read and write data. Further description of memory states and threshold voltages is provided in further detail below with respect to programming, program verify, and read operations.

Figures 5A, 5B:
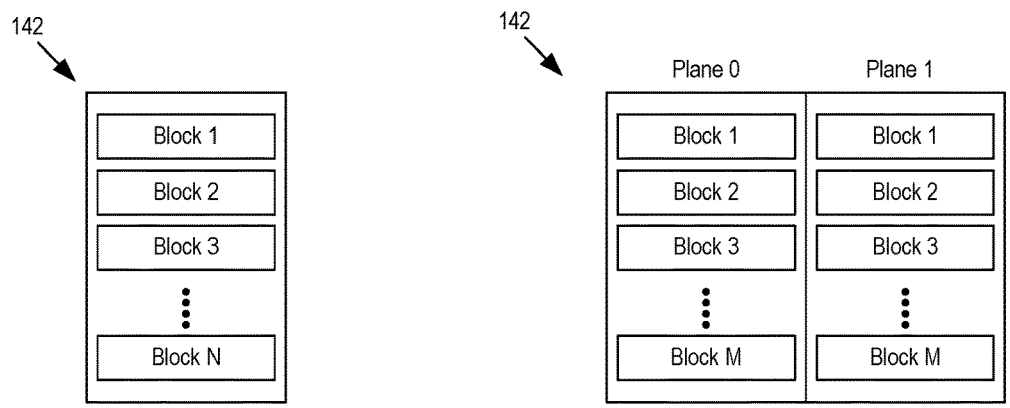
FIG. 5A is a block diagram of a plurality of memory cells organized into blocks.
FIG. 5B is a block diagram of a plurality of memory cells organized into blocks in different planes.

Referring to FIG. 5A, the memory cells 142 may be organized into an N-number of blocks, extending from a first block Block 1 to an Nth block Block N. Referring to FIG. 5B, for some example configurations, the N-number of blocks are organized into a plurality of planes. FIG. 5B shows an example configuration where the blocks are organized into two planes, including a first plane Plane 0 and a second plane Plane 1. Each plane is shown as included an M-number of blocks, extending from a first block Block 1 to an Mth block Block M. Data stored in different planes may be sensed simultaneously or independently.

For configurations where the memory cells are organized into a two-dimensional array, the memory cells may be configured in a matrix-like structure of rows and columns in each of the blocks. At the intersection of a row and a column is a memory cell. A column of memory cells is a referred to as a string, and memory cells in a string are electrically connected in series. A row of memory cells is referred to as a page. Where the memory cells are FGTs, control gates of FGTs in a page or row may be electrically connected together.

Additionally, each of the blocks includes word lines and bit lines connected to the memory cells. Each page of memory cells is coupled to a word line. Where the memory cells are FGTs, each word line may be coupled to the control gates of the FGTs in a page. In addition, each string of memory cells is coupled to a bit line. Further, a single string may span across multiple word lines, and the number of memory cells in a string may be equal to the number of pages in a block.

Figure 6:
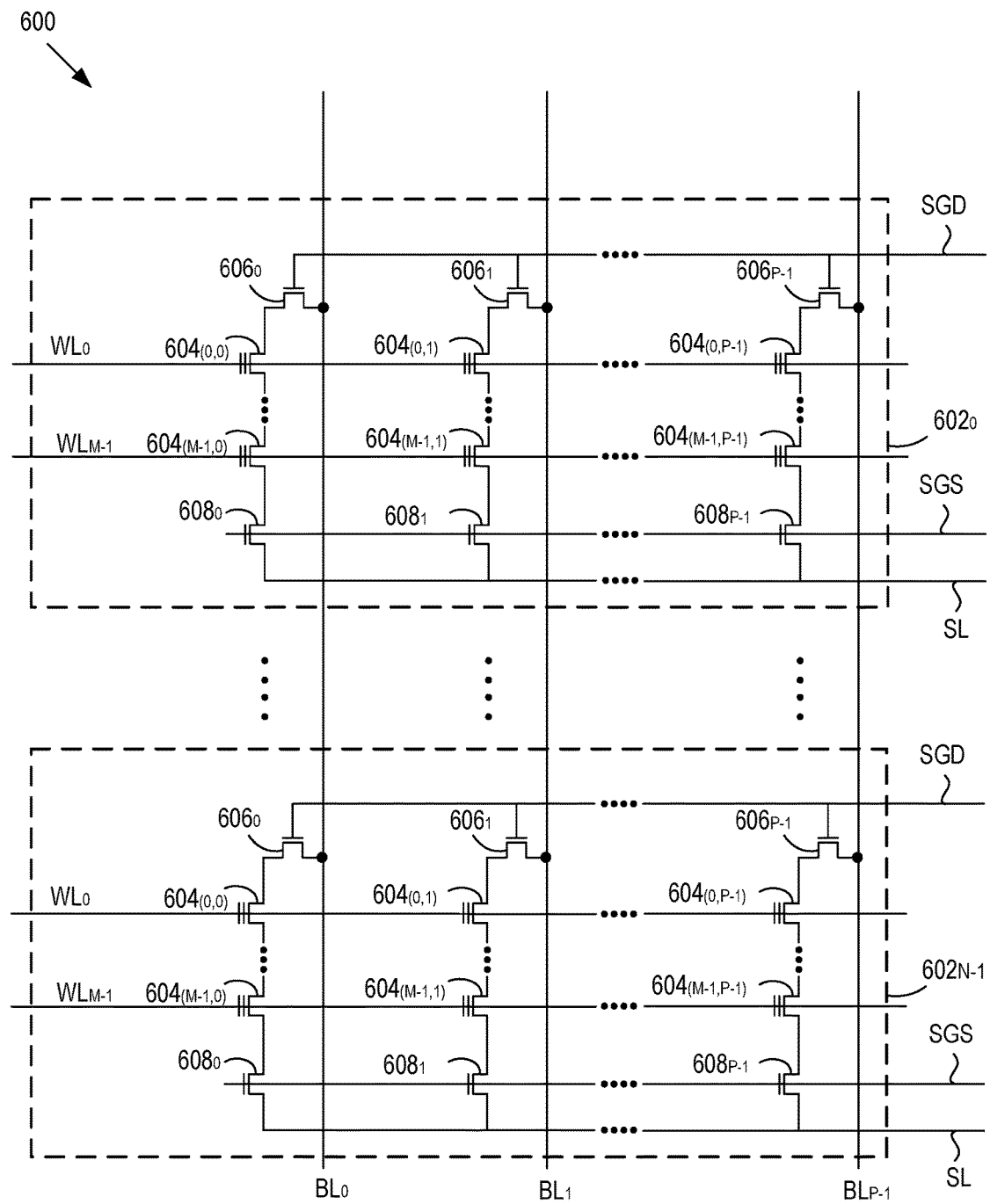
FIG. 6 is a circuit diagram of an example two-dimensional NAND-type flash memory array.

FIG. 6 is a circuit schematic diagram of at least a portion of an exemplary two-dimensional NAND-type flash memory array 600, which may be representative of at least a portion of the plurality of memory cells 142. For example, the memory array 600 may be representative of a single plane of blocks on a memory die 104. The memory array 600 may include an N-number of blocks $602_0$ to $602_{N-1}$. Each block 602 includes a P-number of strings of FGTs 604, with each string coupled to respective one of a P-number of bit lines $BL_0$ to $BL_{P-1}$. Additionally, each block 602 includes an M-number of pages of FGTs 604, with each page coupled to a respective one of an M-number of word lines $WL_0$ to $WL_{M-1}$. Each ith, jth FGT(i,j) of a given block 602 is connected to an ith word line $WL_i$, and to a jth bit line $BL_j$ of the given block. As shown in FIG. 6, bit lines $BL_0$ to $BL_{P-1}$ are shared among the blocks $602_0$ to $602_{N-1}$ may be which are shared among the blocks, such as blocks within the same plane.

Within each block 602, each string is connected at one end to an associated drain select gate transistor 606, and each string is coupled to its associated bit line BL via the associated drain select gate transistor 606. Switching of the drain select gate transistors $606_0$ to $606_{P-1}$ may be controlled using a drain select gate bias line SGD that supplies a drain select gate bias voltage $V_{SGD}$ to turn on and off the drain select transistors $606_0$ to $606_{P-1}$. In addition, within each block 602, each string is connected at its other end to an associated source select gate transistor 608, and each string is coupled to a common source line SL via the associated source select gate transistor 608. Switching of the source select gate transistors $608_0$ to $608_{P-1}$ may be controlled using a source select gate bias line SGS that supplies a source select gate bias voltage $V_{SGS}$ to turn on and off the source select transistors $608_0$ to $608_{P-1}$. Also, although not shown, in some cases, dummy word lines, which contain no user data, can also be used in the memory array 600 adjacent to the source select gate transistors $608_0$ to $608_{P-1}$. The dummy word lines may be used to shield edge word lines and FGTs from certain edge effects.

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with two-dimensional (planar) NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
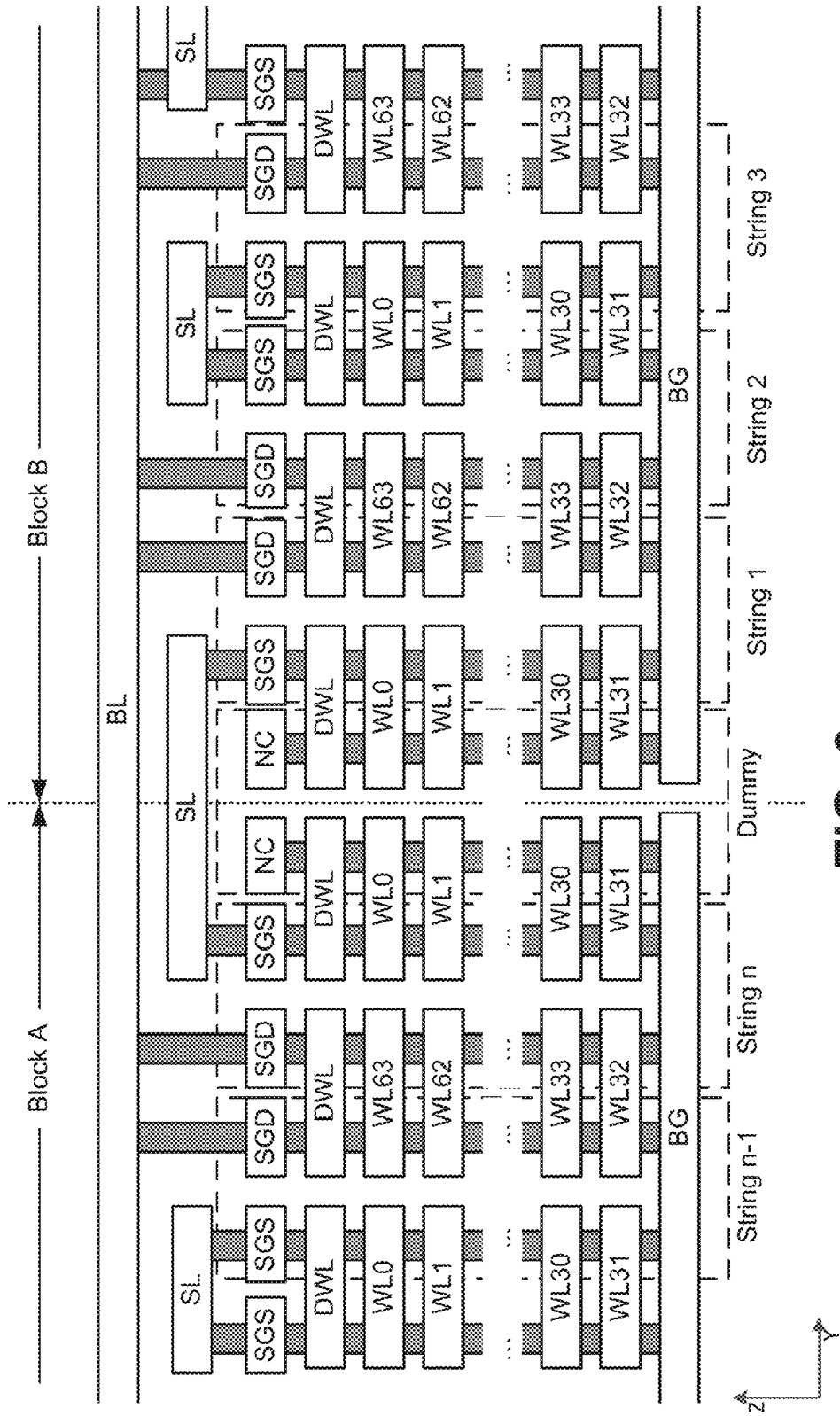
FIG. 9 is a cross-sectional view of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n separately-selectable sets of strings (String 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10A:
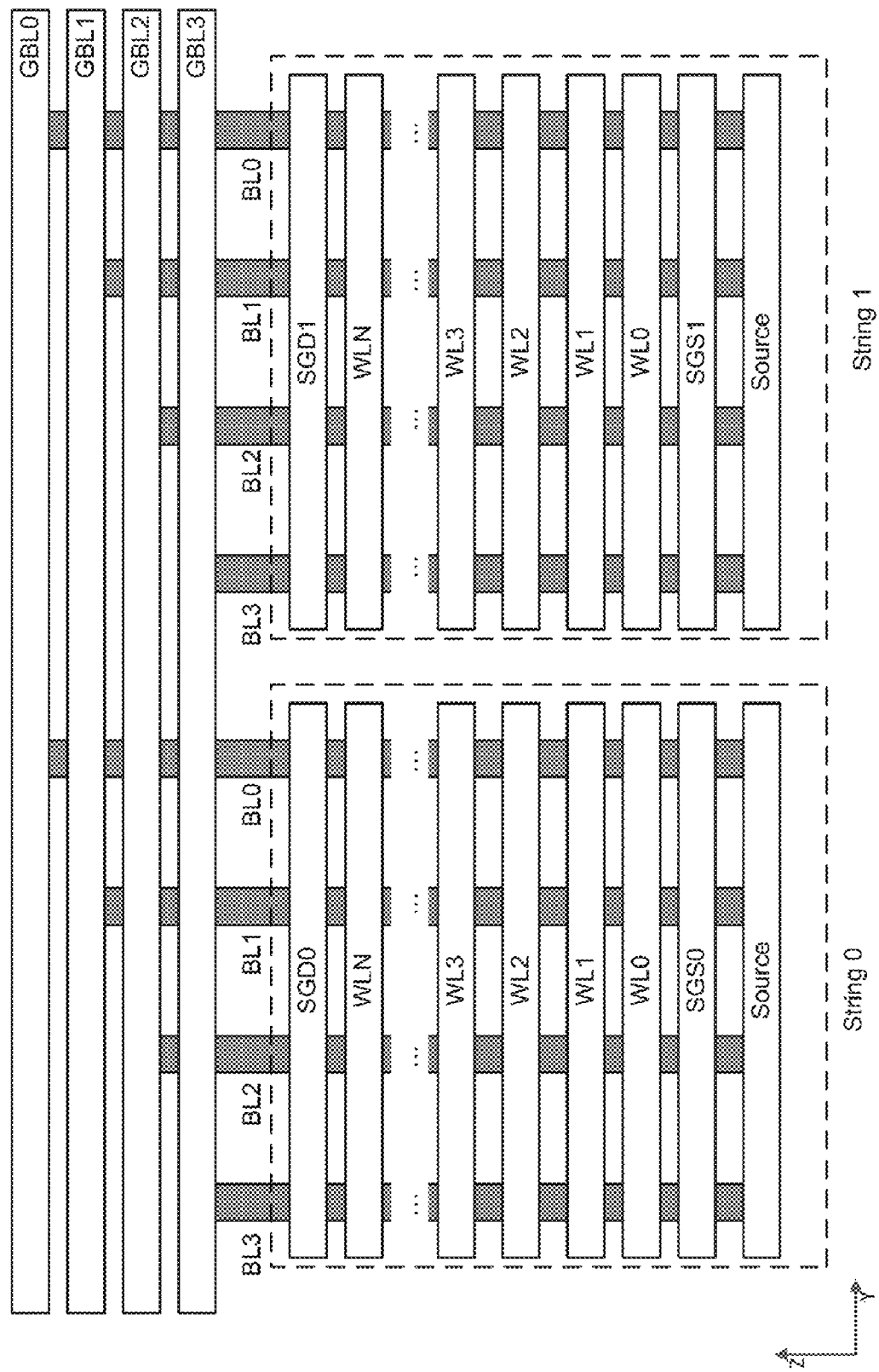
FIG. 10A is a cross-sectional view along the bit line direction (along the y-direction) of an example memory structure in which straight vertical NAND strings extend from common source connections in or near a substrate to global bit lines that extend over physical levels of memory cells.

FIG. 10A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 10A shows only portions of GBL0 GBL3, and that these bit lines extend further in the y-direction and may connect with additional NAND strings in the block and in other blocks. Furthermore, additional bit lines extend parallel to GBL0 GBL3 (e.g. at different locations along x-axis, in front of, or behind the location of the cross-section of FIG. 10A).

Figure 10B:
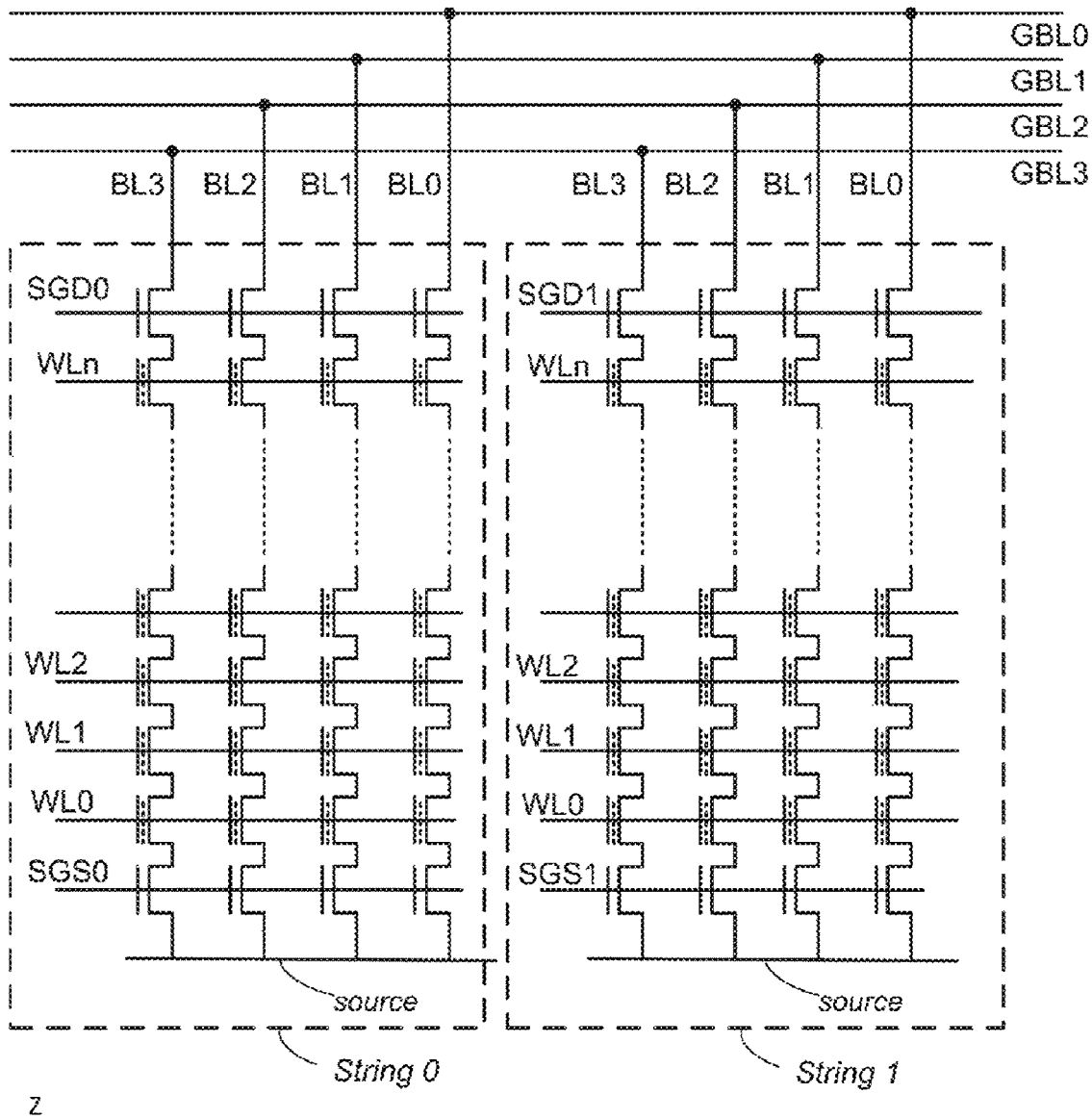
FIG. 10B is a circuit diagram of separately-selectable sets of NAND strings of FIG. 10A.

FIG. 10B illustrates separately-selectable sets of NAND strings of FIG. 10A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 10C:
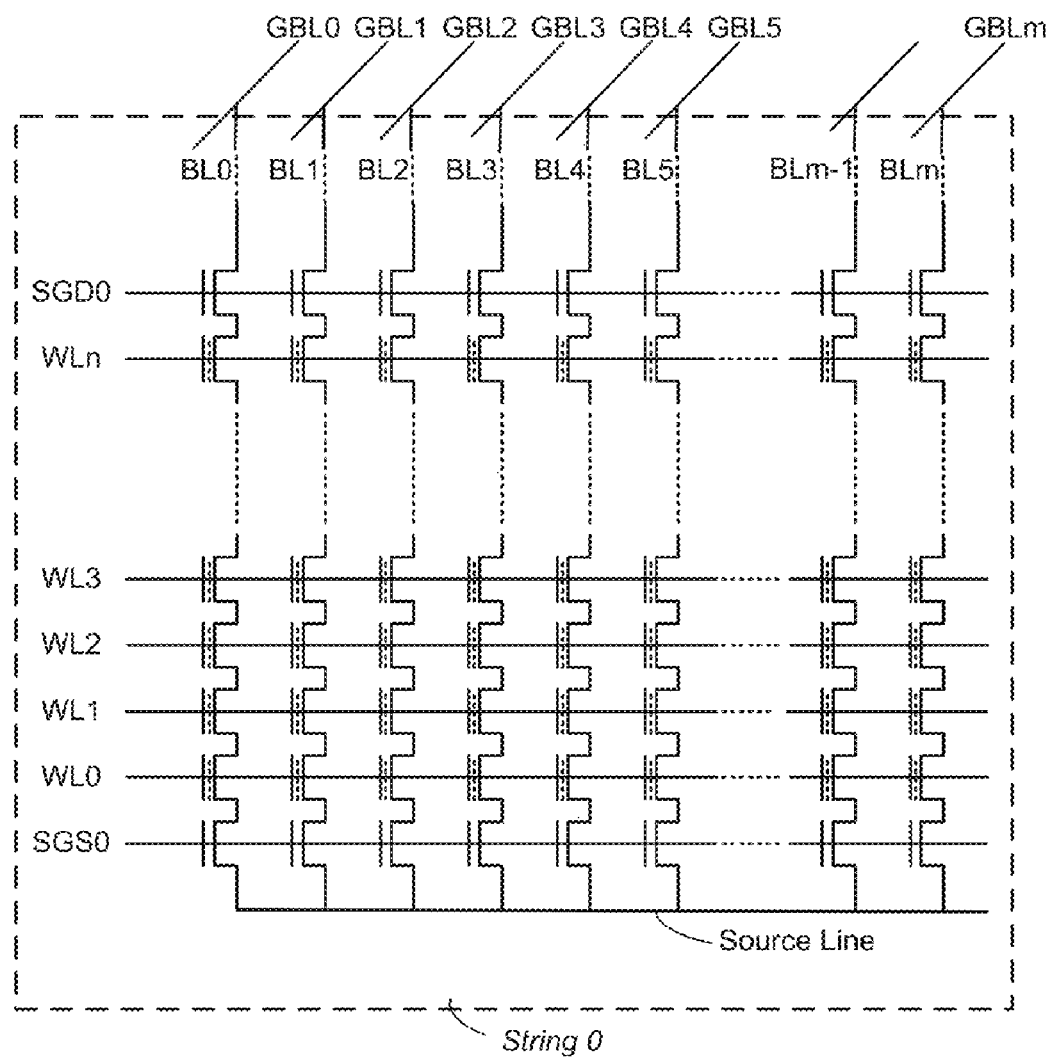
FIG. 10C is a circuit diagram of a separately selectable set of NAND strings in cross section along the x-z plane.

FIG. 10C shows a separately selectable set of NAND strings, String 0, of FIGS. 10A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Referring back to FIG. 2B, the memory die 104 may further include read/write circuits 144 that includes a plurality or p-number of sense blocks (also referred to as sense modules or sense circuits) 146. As described in further detail below, the sense blocks 146 are configured to participate in reading or programming a page of memory cells in parallel.

The memory die 104 may also include a row address decoder 148 and a column address decoder 150. The row address decoder 148 may decode a row address and select a particular word line in the memory array 142 when reading or writing data to/from the memory cells 142. The column address decoder 150 may decode a column address to select a particular group of bitlines in the memory array 142 to read/write circuits 144.

In addition, the non-volatile memory die 104 may include peripheral circuitry 152. The peripheral circuitry 152 may include control logic circuitry 154, which may be implemented as a state machine, that provides on-chip control of memory operations as well as status information to the controller 102. The peripheral circuitry 152 may also include an on-chip address decoder 156 that provides an address interface between addressing used by the controller 102 and/or a host and the hardware addressing used by the row and column decoders 148, 150. In addition, the peripheral circuitry 152 may also include volatile memory 158. An example configuration of the volatile memory 158 may include latches, although other configurations are possible.

In addition, the peripheral circuitry 152 may include power control circuitry 160 that is configured to generate and supply voltages to the memory array 142, including voltages (including program voltage pulses) to the wordlines, erase voltages (including erase voltage pulses), the source select gate bias voltage $V_{SSG}$ to the source select gate bias line SSG, the drain select gate bias voltage $V_{DSG}$ to the drain select gate bias line DSG, a cell source voltage $V_{celsrc}$ on the source lines SL, as well as other voltages that may be supplied to the memory array 142, the read/write circuits 144, including the sense blocks 146, and/or other circuit components on the memory die 104. The various voltages that are supplied by the power control circuitry 160 are described in further detail below. The power control circuitry 160 may include any of various circuit topologies or configurations to supply the voltages at appropriate levels to perform the read, write, and erase operations, such as driver circuits, charge pumps, reference voltage generators, and pulse generation circuits, or a combination thereof. Other types of circuits to generate the voltages may be possible. In addition, the power control circuitry 160 may communicate with and/or be controlled by the control logic circuitry 154, the read/write circuits 144, and/or the sense blocks 146 in order to supply the voltages at appropriate levels and appropriate times to carry out the memory operations.

In order to program a target memory cell, and in particular a FGT, the power control circuitry 160 applies a program voltage to the control gate of the memory cell, and the bit line that is connected to the target memory cell is grounded, which in turn causes electrons from the channel to be injected into the floating gate. During a program operation, the bit line that is connected to the target memory cell is referred to as a selected bit line. Conversely, a bit line that is not connected to a target memory cell during a program operation is referred to as an unselected bit line. In this context, a state of the bit line may refer to whether the bit line is selected or unselected. Otherwise stated, a bit line can be in one of two states, selected or unselected. When electrons accumulate in the floating gate, the floating gate becomes negatively charged and the threshold voltage $V_{TH}$ of the memory cell is raised. The power control circuitry 160 applies the program voltage $V_{PGM}$ on the wordline that is connected to the target memory cell in order for the control gate of the target memory cell to receive the program voltage $V_{PGM}$ and for the memory cell to be programmed. As previously described, in a block, one memory cell in each of the NAND strings share the same word line. During a program operation, the word line that is connected to a target memory cell is referred to as a selected word line. Conversely, a word line that is not connected to a target memory cell during a program operation is referred to as an unselected word line.

Figure 11A:
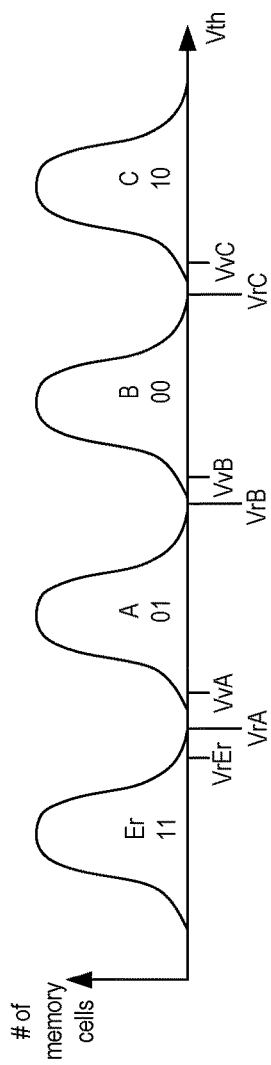
FIG. 11A is a plot of threshold voltage distribution curves for memory cells storing two bits of data.
Figure 11B:
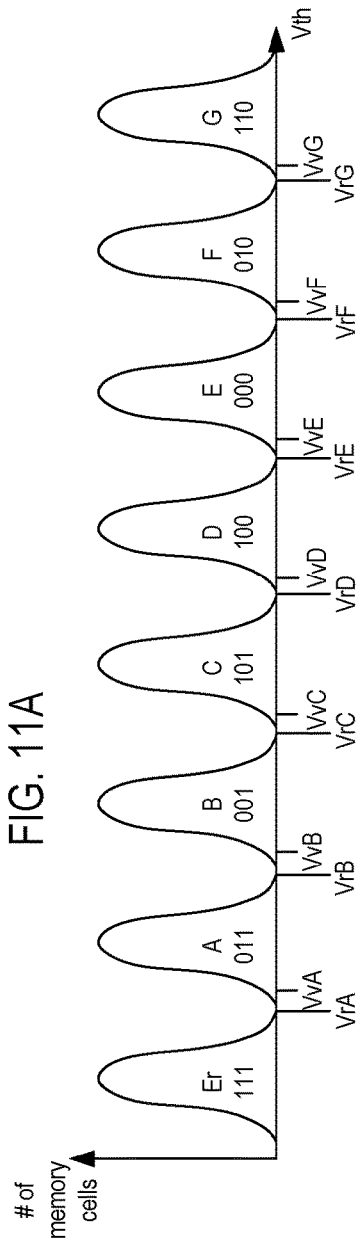
FIG. 11B is a plot of threshold voltage distribution curves for memory cells storing three bits of data.
Figure 11C:
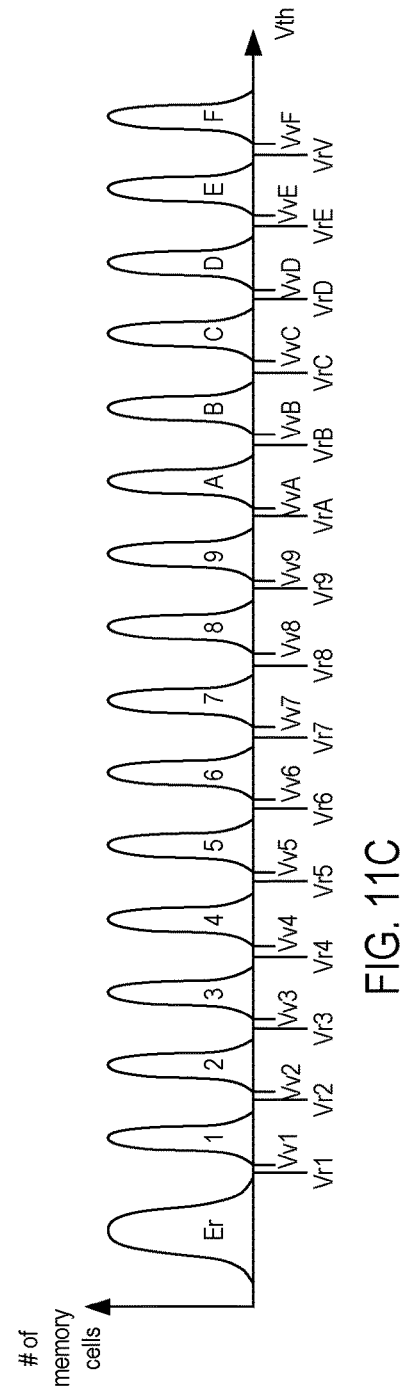
FIG. 11C is a plot of threshold voltage distribution curves for memory cells storing four bits of data.

FIGS. 11A-11C are plots of threshold voltage distribution curves for different numbers of bits being stored the memory cells. The threshold voltage distribution curves are plotted for threshold voltage $V_{TH}$ as a function of the number of memory cells. FIG. 11A show threshold voltage distribution curves for memory cells programmed to store two bits of data, FIG. 11B show threshold voltage distribution curves for memory cells programmed to store three bits of data, and FIG. 11C show voltage distribution curves for memory cells programmed to store four bits of data. Similar threshold voltage distribution curves may be generated for memory cells programmed to store numbers of bits other than two, three, and four.

At a given point in time, each memory cell may be a particular one of a plurality of memory states (otherwise referred to as a data state). The memory states may include an erased stated and a plurality of programmed states. Accordingly, at a given point in time, each memory cell may be in the erased state or one of the plurality of programmed states. The number of programmed states corresponds to the number of bits the memory cells are programmed to store. With reference to FIG. 11A, for a memory cell programmed to store two bits, the memory cell may be in an erased state Er or one of three programmed states A, B, C. With reference to FIG. 11B, for a memory cell programmed to store three bits, the memory cell may be in an erased state Er or one of seven programmed states A, B, C, D, E, F, G. With reference to FIG. 11C, for a memory cell programmed to store four bits, the memory cell may be in an erased state Er or one of fifteen programmed states 1, 2, 3, 4, 5, 6, 7, 8, 9, A, B, C, D, E, F. As shown in FIGS. 11A-11C, each voltage distribution curve is associated with the erased state or one of the programmed states.

Additionally, each threshold voltage distribution curve defines and/or is associated with a distinct threshold voltage range that, in turn, defines, is assigned, or is associated with a distinct one of a plurality of predetermined n-bit binary values. As such, determining what threshold voltage $V_{TH}$ a memory cell has allows the data (i.e., the logic values of the bits) that the memory cell is storing to be determined. The specific relationship between the data programmed into the memory cells and the threshold voltage levels of the memory cell depends on the data encoding scheme used for programming the memory cells. In one example, as shown in FIGS. 11A and 11B, a Gray code scheme is used to assign data values to the threshold voltage distribution curves. Under this scheme, for memory cells programmed with two bits of data, the data value "11" is assigned to the range of threshold voltages associated with the erased state Er, the data value "01" is assigned to the range of threshold voltages associated with programmed state A, the data value "00" is assigned to the range of threshold voltages associated with programmed state B, and the data value "10" is assigned to the range of threshold voltages associated with the programmed state C. Similar relationships between data values and memory states can be made for memory cells programmed to store three bits, four bits, or other bits of data.

Prior to performance of a program operation that programs a plurality or group of target memory cells, all of the memory cells of the group subjected to and/or selected to be programmed in the programming operation may be in the erased state. During the programming operation, the power control circuitry 160 may apply the program voltage to a selected word line and in turn the control gates of the target memory cells as a series of program voltage pulses. The target memory cells being programmed concurrently are connected to the same, selected word line. In many programming operations, the power control circuitry 160 increases the magnitude of the program pulses with each successive pulse by a predetermined step size. Also, as described in further detail below, the power control circuitry 160 may apply one or more verify pulses to the control gate of the target memory cell in between program pulses as part of a program loop or a program-verify operation. Additionally, during a programming operation, the power control circuitry 160 may apply one or more boosting voltages to the unselected word lines.

The target memory cells connected to the selected word line will concurrently have their threshold voltage change, unless they have been locked out from programming. When the programming operation is complete for one of the target memory cells, the target memory cell is locked out from further programming while the programming operation continues for the other target memory cells in subsequent program loops. Also, for some example programming operations, the control logic circuitry 154 may maintain a counter that counts the program pulses.

During a program operation to program a group of target memory cells, each target memory cell is assigned to one of the plurality of memory states according to write data that is to be programmed into the target memory cells during the program operation. Based on its assigned memory state, a given target memory cell will either remain the erased state or be programmed to a programmed state different from the erased state. When the control logic 154 receives a program command from the controller 102, or otherwise determines to perform a program operation, the write data in stored in latches included in the read/write circuitry 144. During the programming operation, the read/write circuitry 144 can read the write data to determine the respective memory state to which each of the target memory cells is to be programmed.

As described in further detail below, and as illustrated in FIGS. 11A-11C, each programmed state is associated with a respective verify voltage level $V_V$. A given target memory cell is programmed in its assigned memory state when its threshold voltage $V_{TH}$ is above the verify voltage $V_V$ associated with the memory state assigned to that target memory cell. As long as the threshold voltage $V_V$ of the given target memory cell is below the associated verify voltage $V_V$, the control gate of the target memory cell may be subject to a program pulse to increase the target memory cell's threshold voltage $V_{TH}$ to within the threshold voltage range associated with the memory state assigned to the given target memory cell. Alternatively, when the threshold voltage $V_{TH}$ of the given target memory cell increases to above the associated verify voltage level $V_V$, then programming may be complete for the given target memory cell. As described in further detail below, a sense block 146 may participate in a program-verify operation that determines whether programming for a given memory cell is complete.

As previously mentioned, target memory cells subject to a program operation may also be subject to a verify operation that determines when programming is complete for each of the target memory cells. The verify operation is done in between program pulses, and so the programming operation and the verify operation in performed in an alternating or looped manner. The combination of the programming operation and the verify operation is called a program-verify operation. Accordingly, a program-verify operation includes a plurality of programming operations and a plurality of verify operations that are alternatingly performed. That is, a program-verify operation involves a programming operation followed by a verify operation, followed by another programming operation, followed by another verify operation, and so on until the program-verify operation has no more programming or verify operations to be performed. In addition, a single programming operation of a program-verify operation includes the power control circuitry 160 supplying one or more program pulses to the selected word line for that single programming operation, and a single verify operation of a program-verify operation includes the power control circuitry 160 supplying one or more verify pulses to the selected word line for that single programming operation. Accordingly, a program-verify operation may include the power control circuitry 160 supplying a pulse train or a series of voltage pulses to the selected word line, where the pulse train includes one or more program pulses followed by one or more verify pulses, followed by one or more program pulses, followed by one or more verify pulses, and so on until the program-verify process has no more program or verify pulses for the power control circuitry 160 supply to the selected word line.

A program-verify operation is complete when the verify portion of the program-verify operation identifies that all of the memory cells have been programmed to their assigned threshold voltages $V_{TH}$. As mentioned, the verify process verifies or determines that a given target memory cell is finished being programmed when the verify process determines that the target memory cell's threshold voltage has increased to above the verify voltage level $V_V$ associated with the memory state to which the target cell is to be programmed.

For some example program-verify operations, all of the target memory cells subject to a program-verify operation are not subject to a single verify operation at the same time. Alternatively, for a single verify operation, only those target memory cells that are assigned to the same memory state are subject to a verify operation. For a single verify operation, target memory cells that are subject to the single verify operation are called selected memory cells or selected target memory cells, and target memory cells that are not subject to the single verify operation are called unselected memory cells or unselected target memory cells. Likewise, for a group of bit lines connected to the target memory cells of a program-verify operation, bit lines connected to the selected memory cells for a single verify operation are called selected bit lines, and bit lines connected to the unselected memory cells for a single verify operation are called unselected bit lines. In this context, a state of the bit line may refer to whether the bit line is selected or unselected. Otherwise stated, a bit line can be in one of two states, selected or unselected.

For each of the verify operations, the power control circuitry 160, or some combination of the power control circuitry 160, the read/write circuitry 144, and the sense blocks 146, may supply voltages at appropriate levels to the selected and unselected word lines and the selected and unselected bit lines in order for a verify operation to be performed for the selected memory cells of the target memory cells subject to the program-verify operation. For clarity, and unless otherwise specified, the combination of the power control circuitry 160, the read/write circuitry 144, and the sense blocks 146 used to bias the selected and unselected word lines and bit lines at appropriate levels during a given memory operation (e.g., a programming operation, a verify operation, a program-verify operation, a read operation, or an erase operation) is herein referred to collectively as voltage supply circuitry. Voltage supply circuitry may refer to the power control circuitry 160, the sense block circuitry 146, other circuit components of the read/write circuitry 144, or any combination thereof.

For performance of a verify operation in a block, the voltage supply circuitry may supply a drain select gate bias voltage $V_{SGD}$ on the drain select gate bias line SGD to the control gates of the drain select gate transistors (e.g., transistors 606 of FIG. 6) and a source select gate bias voltage $V_{SGS}$ on the source select gate bias line SGS to the control gates of the drain select gate transistors (e.g., transistors 608 of FIG. 6) at levels that turn on the drain select gate transistors and the source select gate transistors in response to the voltage supply circuitry supplying voltages at suitable levels on the common source line SL and to the bit lines.

Additionally, the voltage supply circuitry supplies a source line voltage at a cell source voltage level Vcelsrc, otherwise referred to as the cell source voltage Vcelsrc, on the common source line SL. Further, the voltage supply circuitry biases the drain side of the selected bit lines with a high supply voltage VHSA that is higher in magnitude than the cell source voltage Vcelsrc. The difference between the high supply voltage VHSA and the cell source voltage level Vcelsrc may be great enough to allow current to flow from the drain side to the source side of a string that includes a selected target memory cell in the event that the selected target memory cell has a threshold voltage $V_{TH}$ that allows it to conduct a current. During a verify operation, a selected memory cell can be generally characterized as fully conducting, marginally conducting, or non-conducting, depending on the threshold voltage $V_{TH}$ of the selected memory cell. Also, the voltage supply circuitry biases the drain side of the unselected bit lines to the cell source voltage Vcelsrc. By biasing the drain side and the source side of unselected bit lines to the cell source voltage Vcelsrc, the voltage difference between the drain side and source side voltages will not allow current to flow through the NAND string connected to the unselected bit line. Further, the voltage supply circuitry biases the unselected word lines, and in turn the control gates of FGTs coupled to the unselected word lines, to a read voltage Vread. The read voltage is high enough to cause the FGTs coupled to unselected word lines to conduct a current regardless of its threshold voltage $V_{TH}$. In addition, the voltage supply circuitry biases the selected word line with a control gate reference voltage $V_{CGRV}$, which may be in the form of one or more verify pulses as previously described. The control gate reference voltage $V_{CGRV}$ may be different for verification of target memory cells of different memory states. For example, the voltage supply circuitry may supply a different control gate reference voltage $V_{CGRV}$ (or a control gate reference voltage $V_{CGRV}$ at different level) when verifying target memory cells programmed to state A than when verifying target memory cells programmed to state B, and so on.

Once the voltage supply circuitry supplies the voltages to the selected and unselected word lines and bit lines, and to the drain select gate transistors, source select gate transistors, drain select gate bias line SGD, and source select gate bias line SGS, a sense block can perform a sense operation that identifies whether a selected target memory cell is conducting, and in turn sufficiently programmed. Further details of the sense operation portion of the verify operation are described in further detail below.

As previously described, the threshold voltage $V_{TH}$ of a memory cell may identify the data value of the data it is storing. For a given read operation in a block, a memory cell from which data is to be read is referred to as a selected memory cell, and a memory cell from which data is not to be read is referred to as an unselected memory cell. So, when data is to be read from a page of memory cells for a particular read operation, those memory cells in the page are the selected memory cells, and the memory cells of the block that are not part of the page are the unselected memory cells. Additionally, a word line connected to the page of selected memory cells is referred to as the selected word line, and the other word lines of the block are referred to as the unselected word lines.

During a read operation to read data stored in target memory cells of a page, the sense blocks 146 may be configured to perform a sense operation that senses whether current is flowing through the bit lines connected to the target memory cells of the page. The voltage supply circuitry may supply voltages on the selected and unselected word lines at appropriate levels that cause current to flow or not to flow based on the threshold voltage $V_{TH}$ of the target memory cells. For some configurations, the level of the voltage supplied to the selected word lines may vary depending on the states of the memory cells.

The voltage supply circuitry may also bias the bit lines so that the high supply voltage VHSA is applied to the drain side of the bit lines and the cell source voltage Vcelsrc is applied to the source side of the bit lines to allow for the current flow, provided that the threshold voltage $V_{TH}$ of the selected memory cell allows for it. For some example read configurations, where the sense block 146 can perform a sense operation for fewer than all of the memory cells of a page. For such configurations, the target memory cells of the page that are subject to and/or that are selected for a given sense operation are referred to as selected memory cells or selected target memory cells. Conversely, the target memory cells of the page that are not subject to and/or that are not selected for the sense operation are referred to as unselected memory cells. Accordingly, bit lines connected to selected target memory cells are referred to as selected bit lines, and bit lines connected to unselected target memory cells are referred to as unselected bit lines. In this context, a state of the bit line may refer to whether the bit line is selected or unselected. Otherwise stated, a bit line can be in one of two states, selected or unselected. The voltage supply circuitry can supply the voltages to the selected and unselected word lines and the selected and unselected bit lines at levels in various combinations and/or in various sequences and/or over various sense operations in order determine the threshold voltages of the target memory cells so that the data values of the data that the target memory cells are storing can be determined.

Figure 12:
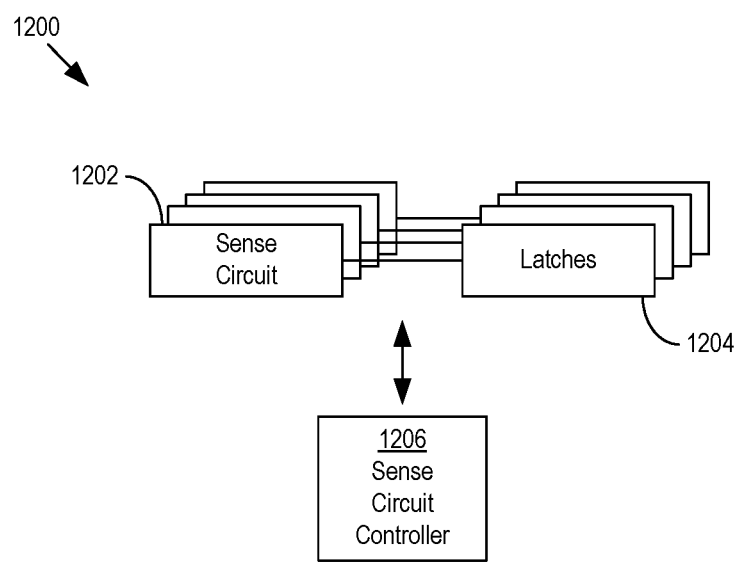
FIG. 12 is a block diagram of an example configuration of a sense block of FIG. 2B.

FIG. 12 is a block diagram of an example configuration of a sense block 1200, which may be representative of one of the sense blocks 146(1) to 146(*p*) of FIG. 2B. The sense block 1200 may include a plurality of sense circuits 1202 and a plurality of sets of latches 1204. Each sense circuit (also referred to as a sense amplifier circuit) 1202 may be associated with a respective one of the latches 1204. That is, each sense circuit 1202 may be configured to communicate with and/or perform a sense operation using data and/or storing data into its associated latches set 1204. Additionally, the sense block 1200 may include a sense circuit controller 1206 that is configured to control operation of the sense circuits 1202 and the sets of latches 1204 of the sense block 1200. The sense circuit controller 1206 may be communicate with and/or may be a part of the control logic 154. The sense circuit controller 1206 may be implemented in hardware, or a combination of hardware and software. For example, the sense circuit controller 1206 may include a processor that executes computer instructions stored in memory to perform at least some of its functions.

Figure 13:
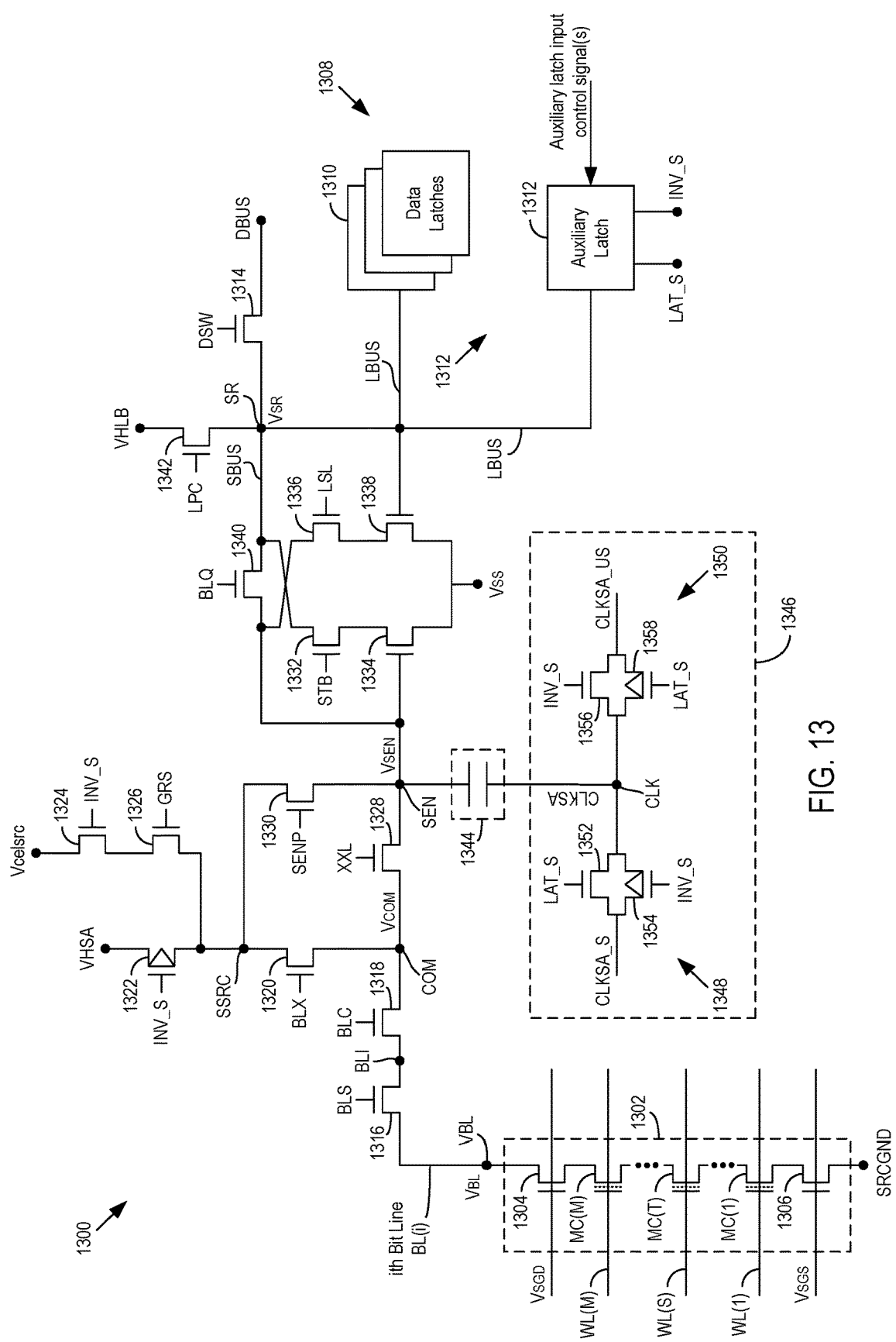
FIG. 13 is a block diagram of an example configuration of a sense circuit of the sense block of FIG. 12.

FIG. 13 is a circuit schematic of an example sense circuit 1300 that may be representative of one of the sense circuits 1202 of the sense block 1200 of FIG. 12, and/or included in one of the sense blocks 146 of FIG. 2B. In addition, the sense circuit 1300 is coupled to and configured to sense current drawn through an associated ith bit line BL(i) connected to an associated NAND string 1302. The ith bit line BL(i) may be one of a plurality bit lines and the NAND string 1302 may be one of a plurality of NAND strings included in a memory cell structure 142 of one of the memory dies 104.

The NAND string 1302 includes an M-number of memory cells MC(1) to MC(M). For purposes of illustration, one of the memory cells MC(1) to MC(M) is identified as being a target memory cell MC(T). For a read operation, the target memory cell MC(T) is a memory cell from which data is to be read and thus, for which a sense operation is performed. For a verification operation, the target memory cell MC(T) is a memory cell being programmed in an associated program-verify operation. FIG. 13 shows the target memory cell MC(T) connected to a selected word line WL(S). FIG. 13 also shows the NAND string 1302 including, on its drain side, a drain select gate transistor 1304 configured to receive a drain select gate voltage $V_{SGD}$ at its control gate, and including, on its source side, a source select gate transistor 1306 configured to receive a source select gate voltage $V_{SGS}$ at its control gate. FIG. 13 also shows the ith bit line BL(i) and associated NAND string 1302 connected to a bit line bias node VBL on its drain side, where the ith bit line is configured to be biased with a bit line bias voltage $V_{BL}$. In addition, the ith bit line BL(i) is connected to a source ground node SRCGND, which is connected to an associated source line SL. As described in further detail below, the source ground node SRCGND may be biased with the cell source voltage Vcelsrc.

In addition, the sense circuit 1300 is connected to and/or in communication with an associated set of latches 1308, which may be representative of a least some of the latches of one of the sets of data latches 1204 of FIG. 12. As shown in FIG. 13, the set of latches 1308 may include one or more data latches 1310 and an auxiliary latch 1312. The data latches 1310 may be configured to store data that is to be programmed into the target memory cell MC(T) or data that is sensed from the target memory cell MC(T). The auxiliary latch 1312 may be configured to generate and output a select voltage LAT_S at a first output node and an unselect voltage INV_S at a second output node. The select and unselect voltages LAT_S, INV_S may be inverses of each other, meaning that when the auxiliary latch 1312 generates one at an associated high voltage level, it generates the other at an associated low voltage level. As used herein, the high voltage level for the select and unselect voltages LAT_S, INV_S is a voltage level that turns on n-channel metal-oxide-semiconductor field-effect transistors (PMOS transistor) and that turns off p-channel metal-oxide-semiconductor field-effect transistors (NMOS transistor). In addition, the low voltage level for the select and unselect voltages LAT_S, INV_S is a voltage level that turns off NMOS transistors and that turns on PMOS transistors.

The sense circuit controller 1206 may be configured to output one or more auxiliary latch control signals to cause the auxiliary latch 1312 to generate and output the select voltage LAT_S at its high voltage level and the unselect voltage INV_S at its low voltage level, or to generate and output the select voltage LAT_S at its low voltage level and the unselect voltage at its high voltage level. In particular, for a given sense operation, if the sense circuit controller 1206 determines that the ith bit line BL(i) is a selected bit line, then the sense circuit controller 1206 may output the one or more auxiliary latch control signals to cause the auxiliary latch 1312 to generate and output the select voltage LAT_S at its high voltage level and the unselect voltage INV_S at its low voltage level. Alternatively, if the sense circuit controller 1206 determines that the ith bit line BL(i) is an unselected bit line, then the sense circuit controller 1206 may output the one or more auxiliary latch control signals to cause the auxiliary latch 1312 to generate and output the select voltage LAT_S at its low voltage level and the unselect voltage INV_S at its high voltage level.

In addition, the sense circuit 1300, the set of latches 1308, and the sense circuit controller 1206 may be configured to communicate with each other via a plurality of buses. As described in further detail below, for a given sense operation, the sense circuit 1300 may be configured to generate a sense result voltage $V_{SR}$ at a sense result node SR that indicates of a result of the sense operation. The sense result node SR may be connected to or be part of a first bus, referred to as an SBUS. The sense circuit 1300 may be configured to communicate the sense voltage $V_{SR}$ to the sense circuit controller 1206 and/or the latches 1308 via the SBUS. In addition, the latches 1308 may be configured to communicate with the sense circuit 1300 and the sense circuit controller 1206 via a second bus, referred to as an LBUS. In the example configuration shown in FIG. 13, the SBUS and the LBUS are shorted together, although in other example configurations, a transistor or other similar circuitry may be included in between the SBUS and the LBUS that electrically connects and disconnects the SBUS and the LBUS. In addition, the sense circuit controller 1206 may be configured to communicate with the SBUS and the LBUS via a third bus, referred to as a DBUS. The DBUS may include or be connected to a DSW transistor 1314 that has a gate terminal configured to receive a DSW control signal from the sense circuit controller 1206. The sense circuit controller 1206 may be configured to electrically connect and disconnect the DBUS (and itself) from the SBUS and the LBUS through control of the DSW transistor 1314.

The sense circuit 1300 further may include a BLS transistor 1316 that has a gate terminal configured to receive a BLS control signal from the sense circuit controller 1206, a drain terminal connected to a BLI node, and a source terminal connected to the ith bit line BL(i). In addition, the sense amplifier 1300 may include a BLC transistor 1318 having a gate terminal configured to receive a BLC control signal from the sense circuit controller 1206, a source terminal connected to the drain terminal of the BLS transistor 1316 at the BLI node, and a drain terminal connected to a communication node COM configured to generate a communication voltage $V_{COM}$. When turned on, the BLS transistor 1316 and the BLC control signal 1318 electrically couple the ith bit line BL(i) to the rest of the sense circuit 1300. Alternatively, when the BLS transistor 1316 or the BLC transistor 1318 is turned off, the ith bitline BL(i) is electrically disconnected from the rest of the sense circuit 1300. In general, the BLS transistor 1316 is kept turned on during operation, and the sense circuit controller 1206 may send the BLC control signal to the BLC transistor 1318 to electrically connect and disconnect the ith bit line BL(i) to and from the rest of the sense circuit 1300.

The sense circuit 1300 may further include a BLX transistor 1320 having a gate terminal configured to receive a BLX control signal from the sense circuit controller 1206, a source terminal connected to the communication node COM, and a drain terminal connected to a SSRC node. When turned on, the BLX transistor 1320 is configured to supply a bit line bias voltage $V_{BL}$ to the communication node COM, and in turn to a bit line bias node VBL that biases the ith bit line BL(i), provided that the BLS transistor 1316 and the BLC transistor 1318 are turned on. The amount of the bit line bias voltage VBL may depend on whether the ith bit line BL(i) is a selected bit line or an unselected bit line, as described in further detail below. However, the BLX control signal is a global signal, meaning that the sense circuit controller 1206 outputs the same BLX control signal to the BLX transistor 1320, regardless of whether the ith bit line BL(i) is a selected or an unselected bit line.

The sense circuit 1300 may generate the bit line bias voltage $V_{BL}$ at one of two predetermined voltage bias levels, depending on and/or corresponding to whether the ith bit line BL(i) is a selected bit line or an unselected bit line. When the ith bit line BL(i) is a selected bit line, the sense circuit 1300 may generate the bit line bias voltage $V_{BL}$ at the high supply voltage level VHSA or a level corresponding to the high supply voltage VHSA, and when the ith bit line BL(i) is an unselected bit line, the sense circuit 1300 may generate the bit line bias voltage $V_{BL}$ at the cell source voltage level Vcelsrc or a level corresponding to the cell source voltage Vcelsrc.

The sense circuit 1300 may include a high bias voltage transistor 1322 to generate the bit line bias voltage $V_{BL}$ with the high supply voltage VHSA, and may include a low bias voltage transistor 1324 and a GRS transistor 1326 to generate the bit line bias voltage VBL with the cell source voltage Vcelsrc. Each of the high bias voltage transistor 1322 and the low bias voltage transistor 1324 may include a respective gate terminal that is configured to receive the unselected voltage INV_S. The high bias voltage transistor 1322 is a PMOS transistor and the low bias voltage transistor 1324 is an NMOS transistor. In addition, the high bias voltage transistor 1322 may have a drain terminal configured to receive the high supply voltage VHSA and a source terminal connected to the SSRC node. The low bias voltage transistor 1324 may have a drain terminal configured to receive the cell source voltage Vcelsrc and a source terminal connected to a drain terminal of the GRS transistor 1326. The source terminal of the GRS transistor 1326 may be connected to the SSRC node.

When the ith bit line BL(i) is a selected bit line and the unselected voltage INV_S is at its low voltage level, the high bias voltage transistor 1322 is turned on and the low bias voltage transistor 1324 is turned off so that sense circuit 1300 generates the bit line bias voltage $V_{BL}$ with the high supply voltage VHSA. In particular, when the high bias voltage transistor 1322 is turned on and the low bias voltage transistor 1324 is turned off, the high bias voltage transistor 1322 may supply the high supply voltage VHSA to the SSRC node, and the BLX transistor 1320 may be turned on to generate the communication voltage $V_{COM}$ at the level of the high supply voltage VHSA. The level of the high supply voltage VHSA may be a predetermined, or pre-sense voltage level of the communication voltage $V_{COM}$ in response to or corresponding to the ith bit line BL(i) being a selected bit line. Further, the BLC transistor 1318 and the BLS transistor 1316 may be turned on to generate the bit line bias voltage $V_{BL}$ at or corresponding to the level of the high supply voltage VHSA.

Alternatively, when the ith bit line BL(i) is an unselected bit line and the unselected voltage INV_S is at its high voltage level, the high bias voltage transistor 1322 is turned off and the low bias voltage transistor 1324 is turned on so that the sense circuit 1300 generates the bit line bias voltage $V_{BL}$ with the cell source voltage Vcelsrc. The sense circuit controller 1206 may also output the GRS control signal to turn on the GRS transistor 1326. Accordingly, the low bias voltage 1324 and the GRS transistor 1326 may supply the cell source voltage Vcelsrc to the SSRC node, and the BLX transistor 1320 may be turned on to generate the communication voltage $V_{COM}$ at the level of the cell source voltage Vcelsrc. The level of the cell source voltage Vcelsrc may be a predetermined, or pre-sense level of the communication voltage $V_{COM}$ in response to or corresponding to the ith bit line BL(i) being an unselected bit line. Additionally, the BLC transistor 1318 and the BLS transistor 1316 may be turned on to generate the bit line bias voltage $V_{BL}$ at or corresponding to the level of the cell source voltage Vcelsrc.

The sense circuit 1300 may further include an XXL transistor 1328 having a gate terminal configured to receive an XXL control signal from the sense circuit controller 1206. In addition, the XXL transistor 1328 has a source terminal connected to the communication node COM and a drain terminal connected to a sense node SEN configured to generate a sense voltage $V_{SEN}$. As described in further detail below, when the sense circuit controller 1206 outputs the XXL control signal to turn on the XXL transistor 1328, a charge sharing relationship may form between the sense node SEN and the communication node COM, in that charge accumulated at the communication node COM and charge accumulated at the sense node SEN flows between the two nodes COM, SEN through the XXL transistor 1328. In other words, when the XXL transistor 1328 is turned on, the communication node COM shares the charge it has accumulated with the sense node SEN, and the sense node SEN shares the charge it has accumulated with the communication node COM. Further details of the communication node COM, the sense node SEN, and their charge sharing relationship are described in further detail below.

The sense circuit 1300 may further include a voltage-setting circuit, referred to hereafter as a SENP transistor, 1330 that is configured to set the sense voltage $V_{SEN}$ to the predetermined or pre-sense level of the communication voltage $V_{COM}$ prior to a discharge period when the sense circuit 1300 is connected to an unselected bit line. As described in further detail below, the sense circuit 1300 may be referred to as sending during the discharge period. In this context, a pre-sense level is a level that is set before the sensing in the discharge period. The SENP transistor 1330 has a gate terminal configured to receive a SENP control signal from the sense circuit controller 1206. The SENP transistor 1330 may also have a drain terminal connected to the SSRC node and a source terminal connected to the sense node SEN. As described in further detail below, the SENP transistor 1324 may be a pull-up transistor that is configured to set the sense voltage $V_{SEN}$ to the predetermined or pre-sense level of the communication voltage $V_{COM}$ by pulling up or increasing the voltage level of the sense voltage $V_{SEN}$ to the level of the cell source voltage Vcelsrc prior to a discharge period of a sense operation when the ith bit line BL(i) to which the sense circuit 1300 is connected is an unselected bit line.

In addition, the sense circuit 1300 may include a first series-connected branch of transistors that includes a STB transistor 1332 and a sense transistor 1334. The sense transistor 1334 has a gate terminal connected to the sense node SEN and configured to receive the sense voltage $V_{SEN}$. In addition, the sense transistor 1334 may have a drain terminal connected to a source terminal of the STB transistor 1332 and a source terminal connected to a low supply voltage $V_{SS}$, which for at least some example configurations is a ground reference voltage. The STB transistor 1332 also has a gate terminal configured to receive a STB control signal from the sense circuit controller 1206, and a drain terminal connected to the sense result node SR and/or the SBUS.

The sense transistor 1334 may be configured to turn on and off depending on the level of the sense voltage $V_{SEN}$. When the sense circuit controller 1206 wants to know whether the level of the sense voltage $V_{SEN}$ is at a level to turn on or turn off the sense transistor 1334, the sense circuit controller 1206 may output the STB control signal to turn on the STB transistor 1332. In the event that the level of the sense voltage $V_{SEN}$ is high enough to turn on the sense transistor 1334, then the STB transistor 1332 and the sense transistor 1334 may operate to pull down the sense result voltage $V_{SR}$ at the sense result node SR, and in turn the level of the SBUS, to an associated low level. Alternatively, in the event that the level of the sense voltage $V_{SEN}$ is at a low level to turn off the sense transistor 1334, then the sense result $Vs_{SR}$ at the sense result node SR may remain at a high level.

The sense circuit 1300 may further include a second-series connected branch of transistors that includes a LSL transistor 1338 and a LBUS transistor 1350. The LBUS transistor 1338 may have a gate terminal connected to the LBUS, a source terminal connected to the low supply voltage $V_{SS}$, and a drain terminal connected to source terminal of the LSL transistor 1336. In addition, the LSL transistor 1336 includes a gate terminal configured to receive an LSL control signal from the source circuit controller 1206 and a drain terminal connected to the sense node SEN. When the LSL transistor 1336 and the LBUS transistor 1338 are turned on, they may operate to discharge charge accumulated on the sense node SEN and/or pull down the level of the sense voltage $V_{SEN}$, such as to reset the voltage level of the sense voltage $V_{SEN}$.

The sense circuit 1300 may also include a BLQ transistor 1340 and a LPC transistor 1342. The BLQ transistor 1340 has a gate terminal has a gate terminal configured to receive a BLQ control signal from the sense circuit controller 1206, a drain terminal connected to the sense result node SR and a source terminal connected to the sense node SEN. The LPC transistor 1342 has a gate terminal configured to receive a LPC control signal from the sense circuit controller 1342, a drain terminal configured to receive a second high supply voltage VHLB, and a source terminal connected to the sense result node SR. For some example sense operations, the sense circuit controller 1206 may turn on the BLQ transistor 1340 and the LPC transistor 1342 to set the level of the sense voltage $V_{SEN}$ to the level of the second high supply voltage VHLB. In addition, for some example sense operations, the sense circuit controller 1206 may turn on the LPC transistor 1342 in order to set the level of the sense result node SR to the level of the second high supply voltage VHLB. For example, prior to a discharge period, the sense circuit controller 1206 may turn on the LPC transistor 1342 to set the level of the sense result node SR to the level of the second high supply voltage VHLB. Following the discharge period, the sense circuit controller 1206 may turn on the STB transistor 1332 and determine if the sense transistor 1334 is turned on such that the STB transistor 1332 and the sense transistor 1334 pull down the level of the sense result voltage $V_{SR}$ to the low supply voltage level $V_{SS}$, or if the sense transistor 1334 is turned off such that the STB transistor 1332 and the sense transistor 1334 keep the level of the sense result voltage $V_{SR}$ at the second high supply voltage VHLB.

The sense circuit 1300 may further include a charge-storing circuit 1344 and an input circuit 1346 for the charge-storing circuit 1344. An example configuration of the charge-storing circuit 1344 may be a capacitor, although other circuits configured to store charge and generate a voltage based on the stored charge may be possible. The charge-storing circuit 1344 may include a first end or terminal connected to the sense node SEN and a second end or terminal connected to a pulse node CLK.

The input circuit 1346 is configured to generate an input or pre-sense pulse CLKSA and supply the input pulse CLKSA to the charge-storing circuit 1344. In particular, the input circuit may generate the input pulse CLKSA at the pulse node CLK, and the charge-storing circuit 1344 may receive the input pulse CLKSA by having its second end connected to the pulse node CLK. Upon receipt of the input pulse CLKSA, the charge-storing circuit 1344 may be configured to generate the sense voltage $V_{SEN}$ at the sense node SEN at a pre-charged level that is equal to or that corresponds to the voltage level of the input pulse CLKSA multiplied by a coupling ratio CR associated with the charge-storing circuit 1344. Accordingly, by the charge-storing circuit 1344 being connected to the sense node SEN, the sense node SEN may be configured to generate the sense voltage $V_{SEN}$ at the pre-charged level in response to the input pulse CLKSA.

As previously described with reference to FIG. 2B, the circuitry of the power control circuitry 160, the read/write circuitry 144, the sense blocks 146, or any combination thereof that is used to bias the selected and unselected word lines and bit lines at appropriate levels during a given memory operation is collectively referred to as voltage supply circuitry. The voltage supply circuitry may further be configured to generate and output a pair of voltage pulse signals to the input circuit 1346, including a selected pulse signal CLKSA_S and an unselected pulse signal CLKSA_US. The selected pulse signal CLKSA_S may include a selected pulse, and the unselected pulse signal CLKSA_US may include an unselected pulse. Unless specified otherwise, the terms "selected pulse signal CLKSA_S" and "selected pulse CLKSA_S" are used interchangeably, and the terms "unselected pulse signal CLKSA_US" and "unselected pulse CLKSA_US" are used interchangeably. The voltage supply circuitry may be configured to output the selected and unselected pulses CLKSA_S, CLKSA_US at different times and at different voltage levels, with the voltage level or magnitude of the unselected pulse CLKSA_US being lower than the voltage level of the selected pulse CLKSA_US, as described in further detail below.

The input circuit 1346 may be state-dependent in that it supplies either the selected pulse CLKSA_S or the unselected pulse CLKSA_US to the charge-storing circuit 1344 depending on the state of the ith bit line BL(i) to which the sense circuit 1300 is connected—i.e., depending on whether the ith bit line BL(i) is a selected bit line or an unselected bit line. In particular, the input circuit 1346 may be configured to supply the selected pulse CLKSA_S to the charge-storing circuit 1344 in response to the ith bit line BL(i) being a selected bit line, and may be configured to supply the unselected pulse CLKSA_US to the charge-storing circuit 1344 in response to the ith bit line BL(i) being an unselected bit line. In this context, the selected pulse CLKSA_S is a pulse corresponding to the ith bit line BL(i) being a selected bit line and the unselected pulse CLKSA_US is a pulse corresponding to the ith bit line BL(i) being an unselected bit line.

Herein, the terms "supplying the selected pulse CLK-SA_S as the input pulse CLKSA to the charge-storing circuit" and "supplying the selected pulse CLKSA_S to the charge-storing circuit" are used interchangeably. Similarly, the terms "supplying the unselected pulse CLKSA_US as the input pulse CLKSA to the charge-storing circuit" and "supplying the unselected pulse CLKSA_US to the charge-storing circuit" are used interchangeably.

In a particular example configuration as shown in FIG. 13, the input circuit 1346 may include a first transmission gate (or pass gate) 1348 and a second transition gate (or pass gate) 1350. The first transmission gate 1348 may include an input configured to receive the selected pulse CLKSA_S and an output connected to the pulse node CLK. When enabled, the first transmission gate 1348 is configured to pass or supply the selected pulse CLKSA_S to the pulse node CLK. Similarly, the second transmission gate 1350 may include an input configured to receive the unselected pulse CLKSA_US and an output connected to the pulse node CLK. When enabled, the second transmission gate 1350 is configured to pass or supply the unselected pulse CLKSA_US to the pulse node CLK.

In general, each of the first and second transmission gates 1348, 1350 may be configured to be enabled and disabled. When enabled, each of the first and second transmission gates 1348, 1350 is configured to generate its respective output voltage at a level that matches the level of the input voltage. Otherwise stated, when enabled, each of the first and second transmission gates 1348, 1350 is configured to pass its input voltage to its output voltage. Accordingly, when the first transmission gate 1348 is enabled, in response to receipt of the selected pulse CLKSA_S, the first transmission gate 1348 may pass or supply the selected pulse CLKSA_S to its output, and in turn the pulse node CLK. Likewise, when the second transmission gate 1350 is enabled, in response to receipt of the unselected pulse CLKSA_US, the second transmission gate 1350 may pass or supply the unselected pulse CLKSA_US to its output, and in turn the pulse node CLK. Alternatively, when disabled, the respective outputs of the first and second transmission gates 1348, 1350 may be floating relative to their inputs and as such, be prevented from passing its input voltage to its output voltage. Accordingly, when the first transmission gate 1348 is disabled, in response to receipt of the selected pulse CLKSA_S, the first transmission gate 1348 may reject the selected pulse CLKSA_S or otherwise be prevented from passing or supplying the selected pulse CLKSA_S to its output, and in turn to the pulse node CLK and the charge-storing circuit 1344. Likewise, when the second transmission gate 1350 is disabled, in response to receipt of the unselected pulse CLKSA_US, the second transmission gate 1350 may reject the unselected pulse CLKSA_US or otherwise be prevented from passing or supplying the unselected pulse CLKSA_US to its output, and in turn to the pulse node CLK and to the charge-storing circuit 1344. When the input circuit 1346 or one of its transmission gates 1348, 1350 rejects a pulse it receives or otherwise prevents the pulse from being supplied to the charge-storing circuit 1344, the charge-storing circuit 1344 is unresponsive to that rejected pulse.

The first and second transmission gates 1348, 1350 may be alternatingly enabled. That is, when the first transmission gate 1348 is enabled to supply or output the selected pulse CLKSA_S to the pulse node CLK, the second transmission gate 1350 is disabled to reject the unselected pulse CLKSA_US or otherwise be prevented from passing or supplying the unselected pulse CLKSA_US to the pulse node CLK. Alternatively, when the second transmission gate 1350 is enabled to supply or output the unselected pulse CLKSA_US to the pulse node CLK, the first transmission gate 1348 is disabled to reject the selected pulse CLKSA_S or otherwise be prevented from passing or supplying the selected pulse CLKSA_S to the pulse node CLK.

In addition, the first transmission gate 1348 is configured to be enabled and the second transmission gate 1350 is configured to be disabled when the ith bit line BL(i) is a selected bit line, and the first transmission gate 1348 is configured to be disabled and the second transmission gate 1350 is configured to be enabled when the ith bit line BL(i) is an unselected bit line. In this way, the input circuit 1346 is configured to pass or supply the selected pulse CLKSA_S as the input pulse CLKSA to the charge-storing circuit 1344 when the ith bit line BL(i) is a selected bit line, and pass or supply the unselected pulse CLKSA_US as the input pulse CLKSA to the charge-storing circuit 1344 when the ith bit line BL(i) is an unselected bit line.

In the example configuration shown in FIG. 13, the first and second transmission gates 1348, 1350 may each include an NMOS transistor and a PMOS transistor. In particular, the first transmission gate 1348 may include an NMOS transistor 1352 and a PMOS transistor 1354. The source terminals of the NMOS transistor 1352 and the PMOS transistor 1354 may be connected together and form the input terminal of the first transmission gate 148 that is configured to receive the selected pulse CLKSA_S. Additionally, the drain terminals of the NMOS transistor 1352 and the PMOS transistor 1354 may be connected together and also connected to form the output of the first transmission gate 1348. Similarly, the second transmission gate 1350 may include an NMOS transistor 1356 and a PMOS transistor 1358. The source terminals of the NMOS transistor 1356 and the PMOS transistor 1358 may be connected together and form the input terminal of the second transmission gate 1350 that is configured to receive the unselected pulse CLKSA_US. Additionally, the drain terminals of the NMOS transistor 1356 and the PMOS transistor 1358 may be connected together to form the output of the second transmission gate 1350.

The auxiliary latch 1312 may be configured to supply at least one of the selected voltage LAT_S or the unselected voltage INV_S to the input circuit 1346 to control whether the input circuit 1346 is configured to supply the selected pulse CLKSA_S or the unselected pulse CLKSA_US to the charge-storing circuit 1344. In a particular example configuration, the auxiliary latch 1312 may be configured to control whether each of the first and second transmission gates 1348, 1350 are enabled and disabled by supplying the selected and unselected voltages LAT_S, INV_S to the gate terminals of the NMOS and PMOS transistors 1352, 1354, 1356, 1358. So that the first and second transmission gates 1348, 1350 are alternatingly enabled, the connections between the gate terminals of the first and second transmission gates 1348, 1350 and the output nodes of the auxiliary latch 1312 are reversed. In the example configuration shown in FIG. 13, the NMOS transistor 1352 of the first transmission gate 1348 is configured to receive the selected voltage LAT_S, and the NMOS transistor 1356 of the second transmission gate 1350 is configured to receive the unselected voltage INV_S. In addition, the PMOS transistor 1354 of the first transmission gate 1348 is configured to receive the unselected voltage INV_S and the PMOS transistor 1358 of the second transmission gate 1350 is configured to receive the selected voltage LAT_S. This way, when the ith bit line BL(i) is a selected bit line, the high level of the selected voltage LAT_S supplied to the gate terminal of the NMOS transistor 1352 and the low level of the unselected voltage INV_S supplied to the gate terminal of the PMOS transistor 1354 causes the first transmission gate 1348 to be enabled. When enabled and upon receipt of the selected pulse CLKSA_S, the first transmission gate 1348 may pass or supply the selected pulse CLKSA_S to the pulse node CLK, and in turn to the charge-storing circuit 1344. Additionally, when the ith bit line BL(i) is a selected bit line, the low level of the unselected voltage INV_S supplied to the gate terminal of the NMOS transistor 1356 and the high level of the selected voltage LAT_S supplied to the gate terminal of the PMOS transistor 1358 disables the second transmission gate 1350. When disabled and upon receipt of the unselected pulse CLKSA_US, the second transmission gate 1350 may reject the unselected pulse CLKSA_US or otherwise be prevented from passing or supplying the unselected pulse CLKSA_US to the pulse node CLK. Alternatively, when the ith bit line BL(i) is an unselected bit line, the low level of the selected voltage LAT_S supplied to the gate terminal of the NMOS transistor 1352 and the high level of the unselected voltage INV_S supplied to the gate terminal of the PMOS transistor 1354 causes the first transmission gate 1348 to be disabled. When disabled and upon receipt of the selected pulse CLKSA_S, the first transmission gate 1348 may reject the selected pulse CLKSA_S or otherwise be prevented from passing or supplying the selected pulse CLKSA_S to the pulse node CLK. Additionally, when the ith bit line BL(i) is an unselected bit line, the high level of the unselected voltage INV_S supplied to the gate terminal of the NMOS transistor 1356 and the low level of the selected voltage LAT_S supplied to the gate terminal of the PMOS transistor 1358 enables the second transmission gate 1350. When enabled and upon receipt of the unselected pulse CLKSA_US, the second transmission gate 1350 may pass or supply the unselected pulse CLKSA_US to the pulse node CLK, and in turn to the charge-storing circuit 1344.

Figure 14:
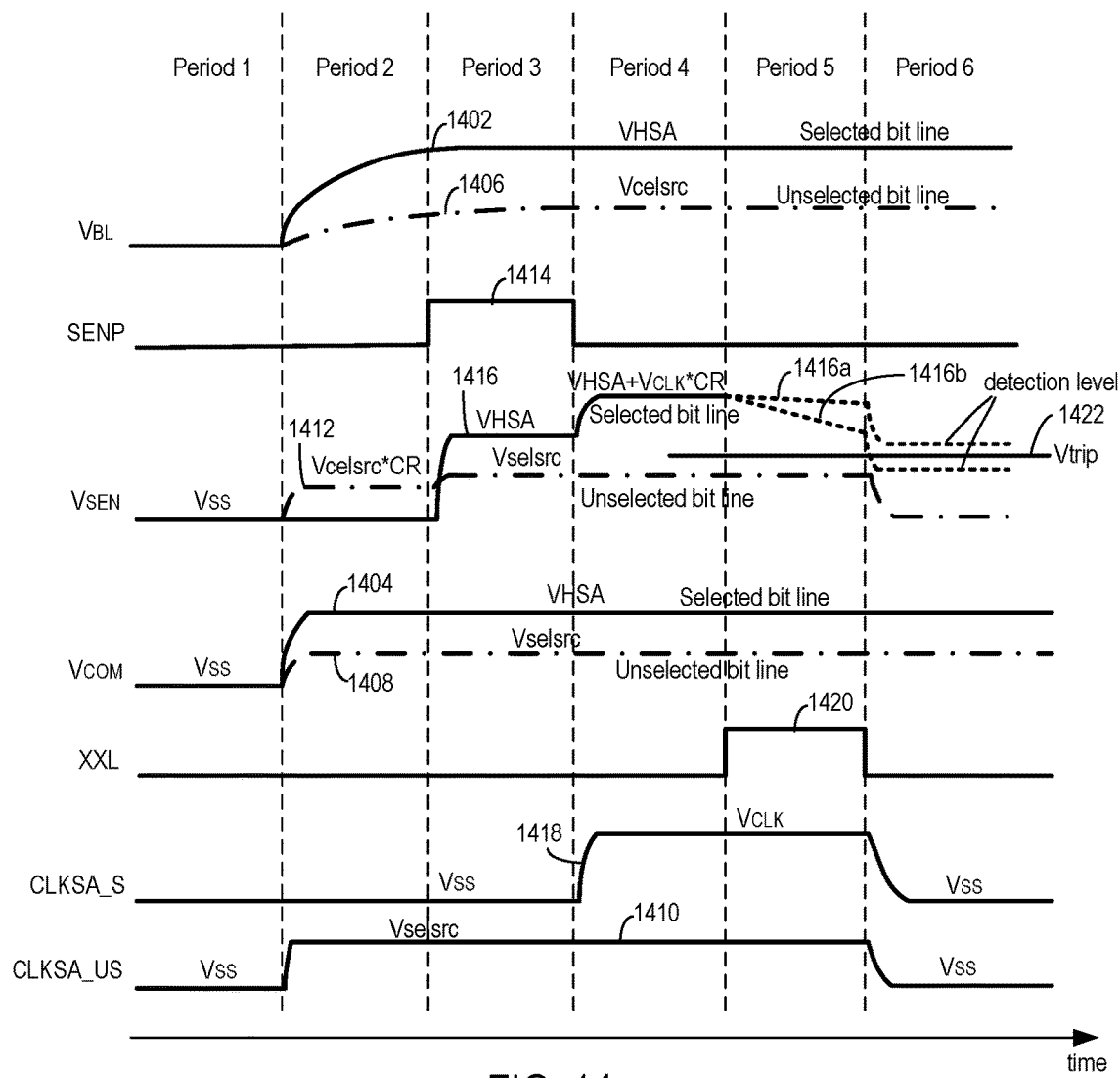
FIG. 14 is a timing diagram of waveforms of voltages and signals generated during a sense operation.

FIG. 14 shows a timing diagram of certain voltages and signals generated in and/or communicated to sense circuits during operation of a sense operation. A method of performing the sense operation is described with reference to FIG. 14. In addition, the method is described with reference to two sense circuits, each with an associated set of latches. The two sense circuits are a selected sense circuit and an unselected sense circuit. The selected sense circuit is referred to as being selected because it is connected to a selected bit line during operation of the sense operation. Similarly, the unselected sense circuit is referred to as being unselected because it is connected to an unselected bit line during operation of the sense operation. Also, the auxiliary latch (e.g., the auxiliary latch 1312) connected to the selected sense circuit is referred to as a selected auxiliary latch, and the auxiliary latch connected to the unselected sense circuit is referred to as an unselected auxiliary latch. Each of the selected and unselected sense circuits may have the configuration of the sense circuit 1300 of FIG. 13.

As previously described, a sense operation may be performed on a group of target memory cells of a block that are connected to the same word line as part of a given read operation or a given verify operation (or a verify portion of a program-verify operation). For the given read operation, the target memory cells are those memory cells in a block from which data values of data are to be determined. For the given verify operation, the target memory cells are those memory cells in a block into which data is being programmed. One or more of the sense blocks 146 shown in FIG. 2B may be involved in one or more sense operations that are part of the given read operation or the given verify operation. In a single sense operation for the given read operation or the given verify operation, some sense circuits 1202 (FIG. 12) of the one or more sense blocks 146 involved in the one or more sense operations may be connected to selected bit lines while other sense circuits 1202 of the one or more sense blocks 146 may be connected to unselected bit lines. For the single sense operation, a sense circuit controller 1206 (FIG. 12) and/or the control logic 154 (FIG. 2B) may want to know whether current, or a threshold amount of current, is conducting through the selected bit lines. The sense circuit controller 1206 and/or the control logic 154 may not want to know whether current, or the threshold amount of current, is conducting through the unselected bit lines.

The control logic 154 and/or one or more of the sense circuit controllers 1206 of the sense blocks 146 may be configured to select which of the bit lines connected to the target memory cells are to be selected bit lines and which are to be unselected bit lines for the single sense operation. For a given read operation, the control logic 154 and/or the one or more sense circuit controllers 1206 may identify the selected and unselected bit lines according to a predetermined read scheme that is used in order to identify the threshold voltages $V_{TH}$ of the memory cells, and in turn the data values of the data the target memory cells are storing. For a given verify operation, the control logic 154 and/or the one or more sense circuit controllers 1206 may identify the selected and unselected bit lines according to a program scheme that is used to program the target memory cells into various, different programmed states.

In accordance with at least some example program schemes, a single sense operation may be associated with a given memory state. For the single sense operation, the control logic 154 and/or the one or more sense circuit controllers 1206 may identify a bit line to be a selected bit line if the target memory cell connected to the bit line is assigned to be programmed into the given memory state associated with the single sense operation. Conversely, the control logic 154 and/or the one or more sense circuit controllers 1206 may identify a bit line to be an unselected bit line if the target memory cell is not assigned to be programmed into the given memory state associated with the single sense operation.

The selected sense circuit involved in the sense operation described with reference to FIG. 14 may be one of the sense circuits connected to a selected bit for a single sense operation that is part of a read operation or a verify operation. Additionally, the unselected sense circuit involved in the sense operation described with reference to FIG. 14 may be one of the sense circuits connected to an unselected bit line for a single sense operation that is part of a read operation or a verify operation.

In addition, the sense operation described with reference to FIG. 14 is performed over six consecutive periods or stages. Other example sense operations may include more or fewer than six periods. As examples, two or more of the six periods may be combined under a single period, one or more of the six periods may be divided into separate periods, or a sense operation may include other periods that are not described and the periods that are described may come before or after the six that are described.

In a first period (Period 1), which may be referred to as a bit line selection period, the control logic 154 and/or the sense circuit controllers 1206 may determine the selected bit lines and the unselected bit lines for the sense operation. For some example sense operations, at least some of the unselected bit lines may be locked out bit lines. As mentioned, a single sense operation of a verify operation may be associated with one of a plurality of programmed states. In general, the control logic 154 and/or the sense circuit controllers 1206 may select those bit lines that are connected to target memory cells assigned to be in the programmed state associated with the sense operation. Several program operations may be needed to successfully program a given memory cell in a given programmed state. Additionally, not all memory cells assigned to the same programmed state may be successfully programmed at the same time or following performance of the same program operation. Of the target memory cells assigned to the same programmed state, which of the target memory cells were successfully programmed and which have not yet been successfully programmed may be determined by the control logic 154 and/or the sense circuit controllers 1206 following a verify operation. Upon identifying which of the target memory cells were successfully programmed, the control logic 154 and/or the sense circuit controllers 1206 may lock out those target memory cells from future programming and verify portions of the program-verify operation. For future program and/or verify operations, the control logic 154 and/or the sense circuit controllers 1206 may identify those locked-out target memory cells as part of the unselected memory cells, and their associated bit lines as unselected bit lines.

As mentioned, the sense operation described with reference to FIG. 14 is described with reference to a selected sense circuit connected to a selected bit line and an unselected sense circuit connected to an unselected bit line. The selected bit line may be one of the selected bit lines identified in the first period. Likewise, the unselected bit line may be one of the unselected bit lines identified in the first period.

In the second period (Period 2), the bit line bias node VBL of the selected sense circuit may be biased to the high supply voltage level VHSA, the bit line bias node VBL of the unselected sense circuit may be biased to the cell source voltage level Vcelsrc, the voltage supply circuitry may supply the unselected pulse CLKSA_US, the sense voltage $V_{SEN}$ in the unselected sense circuit may be set to an initial associated unselected pre-sense level in response to the unselected pulse CLKSA_US, the communication voltage $V_{COM}$ in the selected sense circuit may be set to an associated selected pre-sense level, and the unselected sense circuit may be set to an associated unselected pre-sense level.

In further detail, at the start of the second period, the sense circuit controller 1206 for the selected sense circuit and its associated selected auxiliary latch, may output one or more auxiliary latch input control signals to the selected auxiliary latch to cause the selected auxiliary latch to output its selected voltage LAT_S at its associated high voltage level and its unselected voltage INV_S at its associated low voltage level. The sense circuit controller 1206 may also output the GRS control signal to turn off the GRS transistor 1326, the BLX control signal to turn on the BLX transistor 1320, the BLC control signal to turn on the BLC transistor 1318, and the BLS control signal to turn on the BLS transistor 1316. In response, the bit line bias voltage $V_{BL}$ at the bit line bias node VBL of the selected bit line may begin to increase from the low supply voltage level $V_{SS}$ up to the level of the high supply voltage VHSA, as shown by curve 1402.

In addition, during the second period, due to the high bias voltage transistor 1322 and the BLX transistor 1320 of the selected sense circuit being turned on, the level of the communication voltage $V_{COM}$ generated at the communication node may begin to increase from the level of the low supply voltage $V_{SS}$ up to its associated selected pre-sense level corresponding to the sense circuit being a selected sense circuit connected to a selected bit line, which is the high supply voltage VHSA. The increase in the level of the communication voltage $V_{COM}$ generated in the selected sense circuit is shown by curve 1404 in FIG. 14.

Also, in the second period, a sense circuit controller 1206 for the unselected sense circuit and its associated unselected auxiliary latch may output one or more auxiliary latch input control signals to the unselected auxiliary latch to cause the unselected auxiliary latch to output its selected voltage LAT_S at its associated low voltage level and its unselected voltage INV_S at its associated high voltage level. The sense circuit controller 1206 may also output the GRS control signal to turn on the GRS transistor 1326, the BLX control signal to turn on the BLX transistor 1320, the BLC control signal to turn on the BLC transistor 1318, and the BLS control signal to turn on the BLS transistor 1316. In response, the bit line bias voltage $V_{BL}$ at the bit line bias node VBL of the unselected bit line may begin to increase from the low supply voltage level $V_{SS}$ up to the level of the cell source voltage Vcelsrc, as shown by curve 1406.

In addition, during the second period, due to the low bias voltage transistor 1324, the GRS transistor 1326, and the BLX transistor 1320 of the unselected sense circuit being turned on, the level of the communication voltage $V_{COM}$ generated at the communication node may begin to increase from the level of the low supply voltage $V_{SS}$ to its associated unselected pre-sense level voltage level corresponding to the sense circuit being an unselected sense circuit connected to an unselected bit line. In the example sense operation described with reference to FIG. 14, the associated unselected pre-sense level is the level of the cell source voltage Vcelsrc. The increase in the level of the communication voltage $V_{COM}$ generated in the unselected sense circuit is shown by curve 1408 in FIG. 14.

Further, in the second period, the voltage supply circuitry may begin supplying the unselected pulse CLKSA_US to the input circuits (e.g., the input circuit 1346) of each of the selected sense circuit and the unselected sense circuits, as shown by curve 1410 in FIG. 14. For some example sense operations, the voltage supply circuitry may generate and supply the unselected pulse CLKSA_US at the unselected pre-sense level of the communication node $V_{COM}$ in the unselected sense circuit, which may be the level of the cell source voltage Vcelsrc, as previously described. The voltage supply circuitry may begin supplying the unselected pulse of the unselected pulse signal CLKSA_US by transitioning the voltage of the unselected pulse signal CLKSA_US from the low supply voltage level $V_{SS}$ to the level of the cell source voltage Vcelsrc. Also, as shown in FIG. 14, a duration of the unselected pulse CLKSA_US may extend through the second, third, fourth, and fifth periods, and the voltage supply circuitry may stop its output of the unselected pulse CLKSA_US at the start of the sixth period (Period 6), such as by transitioning the voltage of the unselected pulse signal CLKSA_US from the cell source voltage Vcelsrc to the low supply voltage $V_{SS}$.

With respect to the selected sense circuit, its input circuit 1346, such as with its second transmission gate 1350, may reject the unselected pulse CLKSA_US or otherwise be prevented from passing the unselected pulse CLKSA_US to its pulse node CLK. Instead, its input circuit 1346, such as with its first transmission gate 1348, may maintain its pulse node CLK at the low supply voltage level $V_{SS}$ during the second period.

With respect to the unselected sense circuit, its input circuit, such as with its second transmission gate 1350, may pass or supply the unselected pulse CLKSA_US to its pulse node CLK, and in turn to its charge-storing circuit 1344. In response to receipt of the unselected pulse CLKSA_US, the charge-storing circuit 1344 may increase the level of the sense voltage $V_{SEN}$ it is generating at the sense node SEN from the low supply voltage level $V_{SS}$ to its initial unselected pre-sense level, which may be the cell source voltage Vcelsrc multiplied by a coupling ratio (CR) associated with the charge-storing circuit 1344 of the unselected source circuit. The initial unselected pre-sense level of the sense voltage $V_{SEN}$ that is generated in the unselected sense circuit is represented by curve 1412 in FIG. 14, and the term "Vcelsrc*CR" in FIG. 14 denotes the cell source voltage Vcelsrc multiplied by the coupling ratio associated with the charge-storing circuit 1344. In general, the coupling ratio is a fraction or percentage in a range between zero and one, and so the cell source voltage Vcelsrc multiplied by the coupling ratio is a voltage level that is less than the level of the cell source voltage Vcelsrc. The coupling ratio of the charge-storing circuit 1344 may be indicative of the charge-storing circuit's 1344 ability to transfer energy from one of its ends to the other. In addition or alternatively, the coupling ratio may indicate the fraction of the voltage at the pulse node CLK that the charge-storing circuit 1344 will generate as the sense voltage $V_{SEN}$ at the sense node SEN.

In the third period (Period 3), the SENP transistors 1330 in both the selected sense circuit and the unselected sense are activated to set the sense voltage $V_{SEN}$ generated in the selected sense circuit to an initial selected pre-sense level, and the sense voltage $V_{SEN}$ generated in the unselected sense circuit to a second unselected pre-sense level. In further detail, the sense circuit controller 1206 for both the selected sense circuit and the unselected sense circuit may output the SENP control signal to the SENP control signal to turn on the SENP transistors 1330. This is shown by the waveform 1414, where the sense circuit controllers 1206 transition the SENP control signal from an associated low voltage level to an associated high voltage level. The SENP control signal at the high voltage level may turn on the SENP transistor 1330. For the selected sense circuit, in response to the SENP transistor 1330, the SENP transistor 1330 may pull up the level of the sense voltage $V_{SEN}$ generated at the sense node SEN from the level of the low supply voltage $V_{SS}$ to its initial, selected pre-sense level, which is the level of the high supply voltage VHSA at the SSRC node. The voltage waveform of the sense voltage $V_{SEN}$ generated in the selected sense circuit is represented by curve 1416. For the unselected sense circuit, in response to the SENP transistor 1330 turning on, the SENP transistor 1330 may pull up the sense voltage $V_{SEN}$ generated at the sense node SEN from its initial, unselected pre-sense level (i.e., the cell source voltage level multiplied by the coupling ratio Vcelsrc*CR) to its second, unselected pre-sense level (i.e., the cell source voltage Vcelsrc), which is or matches the unselected pre-sense level of the communication node $V_{COM}$. In other words, the communication voltage $V_{COM}$ is set to the cell source voltage Vcelsrc in the second period, and the SENP transistor 1330 is turned on in the third period to the sense voltage $V_{SEN}$ to a pre-sense level that matches the pre-sense level of the communication voltage $V_{COM}$. The benefits or advantages of the SENP transistor 1330 pulling up the sense voltage $V_{SEN}$ to the pre-sense level of the communication voltage $V_{COM}$ in the unselected sense circuit are described in further detail below.

In the fourth period (Period 4), the voltage supply circuitry may begin supplying the selected pulse CLKSA_S, and the selected sense circuit may respond by increasing the sense voltage $V_{SEN}$ to an associated second selected pre-sense level. In further detail, the voltage supply circuitry may begin supplying the selected pulse CLKSA_S to the input circuits 1346 of the selected sense circuit and the unselected sense circuit. This is shown by the curve 1418 in FIG. 14. The magnitude or voltage level of the pulse may be a selected pulse level $V_{CLK}$, and the voltage supply circuitry may begin supplying the selected pulse of the unselected pulse signal CLKSA_S by transitioning the voltage of the selected pulse signal CLKSA_S from the low supply voltage level $V_{SS}$ to the selected pulse level $V_{CLK}$. Also, as shown in FIG. 14, a duration of the selected pulse CLKSA_S may extend through the fourth and fifth periods, and the voltage supply circuitry may stop its output of the selected pulse CLKSA_S at the start of the sixth period, such as by transitioning the voltage of the selected pulse signal CLKSA_S from the selected pulse level $V_{CLK}$ to the low supply voltage $V_{SS}$.

With respect to the unselected sense circuit, its input circuit 1346, such as with its first transmission gate 1348, may reject the selected pulse CLKSA_S or otherwise be prevented from passing the selected pulse CLKSA_S to its pulse node CLK. Instead, its input circuit 1346, such as with its second transmission gate 1350, may maintain its pulse node CLK at the level of the cell source voltage Vcelsrc, since it is still receiving the unselected pulse CLKSA_US in the fourth period.

With respect to the selected sense circuit, its input circuit, such as with its first transmission gate 1348, may pass or supply the selected pulse CLKSA_S to its pulse node CLK, and in turn to its charge-storing circuit 1344. In response to receipt of the selected pulse CLKSA_S, the charge-storing circuit 1344 may increase the level of the sense voltage $V_{SEN}$ it is generating at the sense node SEN further from its initial selected pre-sense level (the level of the high supply voltage level VHSA) a second, selected pre-sense level, which may be the high supply voltage level VHSA plus the selected pulse level $V_{CLK}$ multiplied by the coupling ratio (CR) associated with the charge-storing circuit 1344 of the selected source circuit, which is denoted by the term "VHSA+$V_{CLK}$*CR" in FIG. 14.

In the fifth period (Period 5), which may also be referred to as the sense period or the discharge period, the XXL transistors 1328 in the selected and unselected sense circuits are turned on and sensing may be performed in the selected sense circuits. In further detail, the sense circuit controllers 1206 for both the selected sense circuit and the unselected sense circuit may output the XXL control signal to the XXL transistor 1328. The sense circuit controllers 1206 may do so by transitioning the level of the XXL signal from an associated low voltage level to an associated high voltage level, as represented by curve 1420 in FIG. 4. In both the selected sense circuit and the unselected sense circuit, turning on the XXL transistor 1328 may cause a short circuit or a relatively low resistance path between the communication node COM and the sense node SEN.

With respect to the selected sense circuit, turning on the XXL transistor 1328 electrically connects the sense node SEN to the selected bit line, forming a current path from the sense node SEN to the bit line bias node VBL (i.e., through the XXL transistor 1328, the BLC transistor 1318, and the BLS transistor 1316). If the selected bit line is drawing current, charge that accumulated at the sense node SEN by the charge-storing circuit 1344 may discharge by flowing through the current path into the selected bit line. The level of the sense voltage $V_{SEN}$ generated by the charge-storing circuit 1344 may decrease in response to the accumulated charge being discharged. In addition, the rate at which level of the sense voltage $V_{SEN}$ decreases is proportional to the rate at which the accumulated charge discharges. During this fifth, discharge period, the selected sense circuit may be considered to be sensing the current drawn through the selected bit line to which it is connected.

Because target memory cells may have different threshold voltages $V_{TH}$ for a given sense operation, the amount of current a selected bit line may draw during a sense operation may vary. FIG. 14 shows the curve 1416 representing the sense voltage $V_{SEN}$ branching off into two possible paths 1416a, 1416b at the start of the fifth period. The first possible path 1416a shows a first situation where the target memory cell drew a relatively small amount of current, and so the sense voltage level correspondingly decreased a relatively small amount over the fifth period. The second possible path 1416b shows a second situation where the target memory cell drew more current than in the first situation, and so the level of the sense voltage $V_{SEN}$ correspondingly decreased a greater amount over the fifth period compared to the first situation.

Referring to the start of the sixth period, the voltage supply circuitry may stop the supply of the selected pulse CLKSA_S by transitioning the level of the selected pulse signal CLKSA_S from the selected pulse voltage level $V_{CLK}$ to the low supply voltage $V_{SS}$. This transition at the start of the sixth period may cause the sense voltage $V_{SEN}$ in the selected sense circuit to fall to a detection amount. FIG. 14 shows the possible voltage paths 1416a, 1416b of the sense voltage $V_{SEN}$ in the selected sense circuit falling to respective detection levels in response to the voltage supply circuitry transitioning the level of the selected pulse signal CLKSA_S from the selected pulse level $V_{CLK}$ to the low supply voltage level $V_{SS}$.

As shown in FIG. 14, the detection level of the sense voltage $V_{SEN}$ in the sixth period may depend on how much the level of the sense voltage $V_{SEN}$ decreased by the end of the fifth period. In general, the lower that the sense voltage $V_{SEN}$ decreased by the end of the fifth period, the lower the detection level will be. Accordingly, FIG. 14 shows the second possible voltage path 1416b falling to a lower detection level than the first possible voltage path 1416a, since the sense voltage $V_{SEN}$ decreased to a lower amount by the end of the fifth period.

During the sixth period, or sometime thereafter, the sense circuit controller 1206 for the selected sense circuit may compare the detection level relative to a trip voltage level Vtrip, as indicated by line 1422 in FIG. 14. The sense circuit controller 1206 may compare the detection level relative to the trip voltage level Vtrip by identifying whether the sense result voltage $V_{SR}$ generated at the sense result node SR is at a high voltage level, which may be or correspond to the second high supply voltage VHLB, or at a low voltage level, which may be the level of the low supply voltage $V_{SS}$. The trip voltage level Vtrip may correspond to the threshold voltage of the sense transistor 1334. Accordingly, when the sense voltage $V_{SEN}$ is above the trip voltage level Vtrip, the sense voltage $V_{SEN}$ is at a level that is capable of turning on the sense transistor 1334. Alternatively, when the sense voltage $V_{SEN}$ is below the trip voltage level Vtrip, the sense voltage $V_{SEN}$ is at a level that is capable of turning off the sense transistor 1334.

During or sometime after the sixth period, after the voltage supply circuitry transitions the level of the selected pulse signal CLKSA_S from the selected pulse level $V_{CLK}$ to the low supply voltage level $V_{SS}$, the sense circuit controller 1206 for the selected sense circuit may output the STB control signal to the STB transistor 1332 to turn on the STB transistor 1332. In response, if the sense voltage $V_{SEN}$ is above the trip voltage level Vtrip, then the sense transistor 1334 will also be turned on, and the STB transistor 1332 and the sense transistor 1334 will operate to pull down the sense result voltage $V_{SR}$ from the level of the second high supply voltage VHLB to the level of the low supply voltage $V_{SS}$. Alternatively, if the sense voltage $V_{SEN}$ is below the trip voltage level Vtrip, then the sense transistor 1334 will be turned off, which will cause the sense result voltage $V_{SR}$ to stay at the level of the second high supply voltage VHLB. For some example configurations, the sense circuit controller 1206 may detect whether the sense result voltage $V_{SR}$ is at its associated high voltage level (VHLB) or its associated low voltage level ($V_{SS}$) by turning on the DSW transistor 1314.

Where the detection level is relative to the trip voltage level Vtrip, as indicated by the level of the sense result voltage $V_{SR}$, may convey information about or a characterization of the state of the target memory cell MC(T) connected to the selected bit line, such as whether it is fully conducting, marginally conducting, or non-conducting, which in turn may convey information about the threshold voltage $V_{TH}$ of the target memory cell MC(T). For example, in a situation where the sense operation is performed as part of a read operation, a detection level above the trip voltage level Vtrip may indicate that the target memory cell MC(T) has a threshold voltage $V_{TH}$ above a read reference voltage level Vr (see FIGS. 11A-11C) for an associated selected word line voltage applied to the selected word line WL(S). Alternatively, a detection level below the trip voltage level Vtrip may indicate that the target memory cell MC(T) has a threshold voltage $V_{TH}$ below a read reference voltage level Vr for an associated selected word line voltage applied to the selected word line WL(S). As another example, in a situation where the sense operation is performed as a verify portion of a program-verify operation, a detection level above the trip voltage level Vtrip may indicate that the target memory cell MC(T) is sufficiently programmed to its assigned memory state. Alternatively, a detection level below the trip voltage level Vtrip may indicate that the target memory cell MC(T) is insufficiently programmed, and thus needs to be subjected to another program-verify loop.

As is evident, the sense voltage $V_{SEN}$ falling to a detection level relative to the trip voltage level Vtrip that accurately reflects the memory state of the target memory cell MC(T) is critical in order for the read and program-verify operations to be successfully performed. Conversely, if the sense voltage $V_{SEN}$ does not fall to a detection level relative to the trip voltage level Vtrip that accurately reflects the memory state of the target memory cell MC(T), the sense controllers 1206 and/or the control logic 154 may identify wrong data values that the target memory cell MC(T) is storing for read operations, or may under-program or over-program the target memory cell MC(T) for program-verify operations.

Noise in the sense circuits may cause the sense voltage $V_{SEN}$ in a selected sense circuit to not fall to a detection level that accurately reflects the memory state of the target memory cell MC(T). In general, noise in the sense circuits is unwanted movement of voltage levels at a node in the sense circuit that disturbs one or more voltage levels on one or more other nodes in the sense circuits.

One way that noise can be generated in the sense circuits is through a difference in voltage levels between the communication node COM and the sense node SEN prior to the fifth period when the XXL transistor 1328 is turned on. That is, suppose prior to the fifth period, the communication voltage $V_{COM}$ and the sense voltage $V_{SEN}$ in the unselected sense circuit are generated at two different voltage levels. At the start of the fifth period, the unselected bit line does not draw current and so a current path is not formed from the sense node SEN to the bit line bias node VBL of the unselected bit line. However, when the XXL transistor 1328 is turned on, the communication node COM and the sense node SEN are effectively shorted together, or the turned on XXL transistor 1328 otherwise provides a relatively low resistance path between the communication node COM and the sense node SEN. When turned on, the XXL transistor 1328 is configured to form a charge-sharing relationship between the communication node COM and the sense node SEN in that the two nodes will share charge they have respectively accumulated prior to the XXL transistor 1328 being turned on. Any difference in voltage between the communication voltage $V_{COM}$ and the sense voltage $V_{SEN}$ may cause current to flow between the two nodes.

In other example sense circuit configurations, the charge-storing circuits 1344 of the various sense circuits involved in a sense operation may receive the same input pulse—i.e., at the same voltage level and at the same time—regardless of whether a given sense circuit is a selected sense circuit or an unselected sense circuit. In other words, the input pulse input to the charge-storing circuits 1344 is a global pulse signal that each sense circuit involved in a given sense operation receives. The magnitude or voltage level of the global input pulse may be the selected pulse level $V_{CLK}$. That level may be determined in order to set the sense voltage $V_{SEN}$ in the selected sense circuits to a sufficiently high, predetermined level of VHSA+$V_{CLK}$*CR in the fourth period. The selected pulse level $V_{CLK}$ may also be a higher voltage level than the level of the cell source voltage Vcelsrc. As such, prior to the start of the fifth period for these other sense circuit configurations, the sense voltage $V_{SEN}$ may be at a higher level than the communication voltage $V_{COM}$ in the unselected sense circuits. For example, when the global input pulse is received, the charge-storing circuit 1344 of an unselected sense circuit may generate the sense voltage $V_{SEN}$ at the selected pulse level multiplied by the coupling ratio, $V_{CLK}$*CR, whereas the communication voltage $V_{COM}$ may be at the level of the cell source voltage Vcelsrc. For this situation, when the XXL transistor 1328 turns on and a charge-sharing relationship forms between the sense node SEN and the communication node COM, the higher sense voltage $V_{SEN}$ may cause an undesirable increase or bump-up in the level of the communication voltage $V_{COM}$. As previously described, the communication voltage $V_{COM}$ may be set to the level of the cell source voltage Vcelsrc through supply of the cell source voltage Vcelsrc to the drain terminal of the low bias voltage transistor 1324. This may be done by connecting the drain terminal of the low bias voltage transistor 1324 to the source ground nodes SRCGND of the bit lines since, since during a sense operation, the voltage supply circuitry biases the source ground nodes SRCGND with the cell source voltage Vcelsrc via the source line SL. However, the desirable bump on the communicate node COM in the unselected sense circuits may create noise on the source ground nodes SRCGND. Since the source ground nodes SRCGND of the selected and unselected bit lines are connected together, the noise created on the source ground nodes SRCGND due to the bump-up in the communication voltages $V_{COM}$ in the unselected sense circuits may cause a corresponding, undesirable bump-up in the communication voltages $V_{COM}$ in the selected sense circuits.

This bump-up in communication voltage $V_{COM}$ in the selected sense circuits may decrease or slow down the rate at which charge accumulated at the sense nodes SEN discharges, which in turn may prevent the level of the sense voltage $V_{SEN}$ from falling down to a detection level below the trip voltage level Vtrip. As a result, the sense circuit controller 1206 may detect the detection level of the sense voltage $V_{SEN}$ as being above the trip voltage level Vtrip when it should have detected the detection level as being below the trip voltage level Vtrip. This occurrence may lead to the sense circuit controller 1206 and/or the control logic 154 to identify the target memory cell MC(T) as storing the wrong data (for read operations), or may incorrectly identify the target memory cell MC(T) as being sufficiently programmed (for program-verify operations).

In contrast, for the configuration of the sense circuit 1300 in FIG. 13, through use of the input circuit 1346 and the SENP transistor 1330, along with the supply of the selected and unselected pulses CLKSA_S and CLKSA_US instead of a global pulse signal, the pre-sense voltage mismatch between the communication voltage $V_{COM}$ and the sense voltage $V_{SEN}$ generated in the unselected sense circuits may be reduced, minimized, or eliminated. When a sense circuit with the configuration shown in FIG. 13 is connected to a selected bit line, its input circuit 1346 passes the selected pulse CLKSA_S to its charge-storing circuit 1344, which in turn generates its sense voltage $V_{SEN}$ at a selected pre-sense or predetermined voltage level corresponding to the selected bit line. In addition, when another sense circuit with the configuration shown in FIG. 13 is connected to an unselected bit line, it sets the level of its sense voltage $V_{SEN}$ to an unselected pre-sense or predetermined sense voltage level that is lower than the selected pre-sense voltage level, and one that matches the unselected pre-sense level of the communication voltage $V_{COM}$. This other sense circuit connected to the unselected bit line further rejects the selected pulse CLKSA_S so that the level of its sense voltage $V_{SEN}$ does not increase and instead stays matched to the pre-sense level of the communication voltage $V_{COM}$. This, in turn, reduces, minimizes or eliminates the undesirable bump-up in the communication voltage $V_{COM}$ in the unselected sense circuits at the start of the fifth period and the aforementioned problems resulting therefrom.

The reduction, minimization, or elimination of the voltage mismatch between the communication voltage $V_{COM}$ and the sense voltage $V_{SEN}$ is illustrated in FIG. 14. As previously described, the unselected sense circuit sets the level of the communication voltage $V_{COM}$ to its associated unselected pre-sense level in the second period, as indicated by curve 1408. Then, in the third period prior, the sense circuit controller 1206 for the unselected sense circuit turns on the SENP transistor 1330, which pulls up the level of the sense voltage $V_{SEN}$ in the unselected sense circuit to the pre-sense level of the communication voltage $V_{COM}$ (i.e., the source voltage Vcelsrc), as shown by curve 1412. At this time, the levels of the communication voltage $V_{COM}$ and the sense voltage $V_{SEN}$ are matched to the cell source voltage level Vcelsrc, and these matched levels are maintained through the third, fourth, and fifth periods.

Additionally, the voltage supply circuitry supplies the unselected pulse CLKSA_US in a way to ensure that the sense voltage $V_{SEN}$ is generated and maintained at the cell source voltage level Vcelsrc. In particular, the voltage supply circuitry supplies the unselected pulse CLKSA_US at the level of the cell source voltage Vcelsrc, which is lower than the selected pulse level $V_{CLK}$ so that the level of the sense voltage $V_{SEN}$ does not increase to above the level of the communication voltage $V_{COM}$ when the unselected pulse CLKSA_US is supplied. In addition, issuing the unselected pulse CLKSA_US in the second period before the SENP transistor 1330 pulls up the level of the sense voltage $V_{SEN}$ in the third period ensures that the level of the sense voltage $V_{SEN}$ is maintained at the cell source voltage level Vcelsrc when the SENP transistor 1330 pulls it up to that level. For example, if the voltage supply circuitry were instead to supply the unselected pulse CLKSA_US after the SENP transistor 1330 pull up the level of the sense voltage $V_{SEN}$, the supply of the unselected pulse CLKSA_US would increase the level of the sense voltage $V_{SEN}$ to above the cell source voltage level Vcelsrc, such as the cell source voltage level plus the cell source voltage level multiplied by the coupling ratio, or Vcelsrc+Vcelsrc*CR. The voltage supply circuitry may supply the unselected pulse CLKSA_US in order to bring down the level of the sense voltage $V_{SEN}$ in the unselected sense circuit to the low supply voltage level $V_{SS}$ in the sixth period. That is, if the voltage supply circuitry did not supply the unselected pulse CLKSA_US and stop its supply in the sixth period, the sense voltage $V_{SEN}$ would undesirably stay at the cell source voltage level Vcelsrc at the start of the sixth period. In sum, issuing the unselected pulse CLKSA_US at the cell source voltage level Vcelsrc before the SENP transistor 1330 pulls up the voltage to the cell source voltage level Vcelsrc ensures that the sense voltage $V_{SEN}$ is set to and maintained at level of the communication voltage $V_{COM}$ prior to fifth period, while providing a way for the sense voltage $V_{SEN}$ to be brought back down to the low supply voltage level $V_{SS}$ in the sixth period.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

We claim:

1. A circuit comprising:
    a sense circuit coupled to a bit line, the sense circuit comprising:
        a charge-storing circuit configured to generate a sense voltage; and
        an input circuit configured to:
            supply a first pulse to the charge-storing circuit in response to the bit line comprising a selected bit line; and
            supply a second pulse to the charge-storing circuit with a lower magnitude than the first pulse in response to the bit line comprising an unselected bit line.

2. The circuit of claim 1, wherein the input circuit comprises:
    a first transmission gate configured to:
        receive the first pulse; and
        supply the first pulse to the charge-storing circuit in response to at least one voltage enabling the first transmission gate; and
    a second transmission gate configured to:
        receive the second pulse; and
        supply the second pulse to the charge-storing circuit in response to the at least one voltage enabling the second transmission gate.

3. The circuit of claim 2, further comprising:
    an auxiliary latch configured to:
        generate the at least one voltage, the at least one voltage comprising a selected voltage and an unselected voltage;
        supply the selected voltage and the unselected voltage to the input circuit to alternatingly enable and disable the first and second transmission gates.

4. The circuit of claim 1, further comprising:
    voltage supply circuitry configured to supply the first pulse and the second pulse to the input circuit.

5. The circuit of claim 4, wherein the voltage supply circuitry is configured to begin supplying the second pulse to the input circuit before the voltage supply circuitry begins supplying the first pulse to the input circuit.

6. The circuit of claim 1, wherein the sense circuit further comprises:
    a communication node configured to generate a communication voltage at a predetermined level corresponding to the bit line comprising an unselected bit line; and
    a transistor configured to pull up the sense voltage to the predetermined level prior to a discharge period.

7. The circuit of claim 6, further comprising:
    voltage supply circuitry configured to output the second pulse to the input circuit before the transistor pulls up the sense voltage to the predetermined level.

8. The circuit of claim 7, wherein the voltage supply circuitry is configured to output the second pulse at the predetermined level.

9. The circuit of claim 8, wherein the voltage supply circuitry is configured to output the first pulse after the transistor pulls up the sense voltage to the predetermined level.

10. A circuit comprising:
    a sense amplifier circuit connected to a bit line, the sense amplifier circuit comprising:
        a sense node configured to generate a sense voltage in response to a pulse;
        a communication node configured to generate a communication voltage at an unselected pre-sense level;
        a transistor configured to form a charge-sharing relationship between the sense node and the communication node; and
        a voltage-setting circuit configured to:
            set the sense voltage to the unselected pre-sense level prior to a discharge period of a sense operation in response to the bit line comprising an unselected bit line; and
            set the sense voltage to a selected pre-sense level prior to the discharge period in response to the bit line comprising a selected bit line, the selected pre-sense level higher than the unselected pre-sense level.

11. The circuit of claim 10, wherein the pulse comprises a first pulse corresponding to the unselected bit line, the circuit further comprising:
    an input circuit configured to:
        receive the first pulse and a second pulse corresponding to a selected bit line;
        supply the first pulse to a charge-storing circuit connected to the sense node; and reject the second pulse corresponding to the selected bit line in response to the bit line comprising the unselected bit line.

12. The circuit of claim 11, wherein the input circuit comprises:
   a first transmission gate configured to receive the first pulse and supply the first pulse to the charge-storing circuit in response to the bit line comprising the unselected bit line; and
   a second transmission gate configured to prevent the second pulse from being supplied to the charge-storing circuit in response to the bit line comprising the unselected bit line.

13. The circuit of claim 11, further comprising:
   an auxiliary latch configured to control the input circuit to supply the first pulse to the charge-storing circuit and to reject the second pulse in response to the bit line comprising an unselected bit line.

14. The circuit of claim 10, further comprising:
   voltage supply circuitry configured to supply the pulse; and
   a capacitor coupled to the sense node, the capacitor configured to generate the sense voltage at a level corresponding to the unselected pre-sense level multiplied by a coupling ratio of the capacitor in response to the pulse, and
   wherein the voltage-setting circuit is configured to pull-up the voltage from the level corresponding to the unselected pre-sense level multiplied by the coupling ratio to the pre-sense level.

15. The circuit of claim 14, wherein the bit line comprises a first bit line, and wherein the pulse comprises a first pulse corresponding to the unselected bit line, and wherein the voltage supply circuitry is configured to output a second pulse corresponding to the selected bit line after the transistor pulls up the sense voltage to the unselected pre-sense level.

16. A system comprising:
   voltage supply circuitry configured to output a pulse during a sense operation;
   a plurality of sense circuits, wherein each sense circuit of the plurality of sense circuits is connected to a respective one of a plurality of bit lines of a memory block, wherein the plurality of sense circuits comprises:
      a first sense circuit connected to a selected bit line of the plurality of bit lines during the sense operation, the first sense circuit comprising a first capacitor configured to generate a first sense voltage in response to receipt of the pulse;
      a second sense circuit connected to an unselected bit line of the plurality of bit lines during the sense operation, the second sense circuit comprising:
         a second capacitor unresponsive to the pulse; and
         a pull-up transistor configured to pull up a level of a second sense voltage to match a communication voltage level of a communication node.

17. The system of claim 16, wherein:
   the pulse comprises a first pulse corresponding to the selected bit line;
   the voltage supply circuitry is further configured to output a second pulse corresponding to the unselected bit line;
   the first sense circuit further comprises a first input circuit configured to pass the first pulse to the first capacitor and reject the second pulse; and
   the second circuit further comprises a second input circuit configured to pass the second pulse to the second capacitor and reject the first pulse.

18. The system of claim 17, further comprising:
   a first auxiliary latch configured to control whether the first input circuit passes or rejects each of the first and second pulses; and
   a second auxiliary latch configured to control whether the second input circuit passes or rejects each of the first and second pulses.

19. The system of claim 17, wherein the voltage supply circuitry is configured to:
   begin outputting the second pulse before the pull-up transistor pulls up the level of the second sense voltage; and
   begin outputting the first pulse after the pull-up transistor pulls up the level of the second sense voltage.

20. A circuit comprising:
   a sense circuit coupled to a bit line, the sense circuit comprising:
      a charge-storing circuit configured to generate a sense voltage; and
      a first transmission gate configured to:
         receive a first pulse;
         supply the first pulse to the charge-storing circuit in response to the bit line comprising a selected bit line, and in response to at least one voltage enabling the first transmission gate; and
      a second transmission gate configured to:
         receive a second pulse; and
         supply the second pulse to the charge-storing circuit in response to the bit line comprising an unselected bit line, and in response to the at least one voltage enabling the second transmission gate.

* * * * *